United States Patent
Kakinuma

(10) Patent No.: US 11,373,888 B2
(45) Date of Patent: Jun. 28, 2022

(54) PROTECTIVE MEMBER FORMING METHOD AND PROTECTIVE MEMBER FORMING APPARATUS

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 116 days.

(21) Appl. No.: 16/983,062

(22) Filed: Aug. 3, 2020

(65) Prior Publication Data

US 2021/0043469 A1 Feb. 11, 2021

(30) Foreign Application Priority Data

Aug. 7, 2019 (JP) .............................. JP2019-145350

(51) Int. Cl.
*H01L 21/67* (2006.01)
*H01L 21/56* (2006.01)
*H01L 21/683* (2006.01)

(52) U.S. Cl.
CPC ........ *H01L 21/6715* (2013.01); *H01L 21/561* (2013.01); *H01L 21/67017* (2013.01); *H01L 21/67092* (2013.01); *H01L 21/6838* (2013.01)

(58) Field of Classification Search
CPC ............... H01L 21/6715; H01L 21/561; H01L 21/67017; H01L 21/67092; H01L 21/6838; H01L 2221/68327; H01L 2221/6834; H01L 21/6836; H01L 21/67132; H01L 21/56; H01L 21/6835; H01L 21/78; B81C 1/00825; B81C 1/00896

See application file for complete search history.

(56) References Cited

U.S. PATENT DOCUMENTS 10,854,462 B2 * 12/2020 Sekiya ................ H01L 21/3043
2017/0025275 A1 * 1/2017 Hirata .................... H01L 21/268
2017/0301549 A1 * 10/2017 Suzuki ................ H01L 29/1608
2018/0342398 A1 * 11/2018 Sekiya .................... B24B 9/065

FOREIGN PATENT DOCUMENTS

JP 2017050536 A 3/2017

* cited by examiner

*Primary Examiner* — Mohammed Shamsuzzaman
(74) *Attorney, Agent, or Firm* — Greer Burns & Crain Ltd.

(57) ABSTRACT

A protective member forming method for forming a protective member on the top surface of a substrate having projections and depressions on the top surface covers the top surface of the substrate with a resin film, adheres the resin film to the substrate so as to conform to the projections and depressions, supplies a curable liquid resin to a region superimposed on the substrate on the upper surface of the resin film, presses the liquid resin by a flat pressing surface via a cover film, thus spreads the liquid resin and cures the liquid resin, and thereby forms the protective member including the resin film, the cured liquid resin, and the cover film on the top surface of the substrate.

3 Claims, 10 Drawing Sheets

PROTECTIVE MEMBER FORMING METHOD AND PROTECTIVE MEMBER FORMING APPARATUS

BACKGROUND OF THE INVENTION

Field of the Invention

The present invention relates to a protective member forming method and a protective member forming apparatus that form a protective member on the top surface of a substrate having projections and depressions on the top surface.

Description of the Related Art

Device chips used in an electronic apparatus such as a mobile telephone or a computer are formed by grinding and thinning a substrate having a plurality of devices arranged thereon side by side from an undersurface side, thereby dividing the substrate into each device. The grinding of the substrate is performed by a grinding apparatus. The grinding apparatus holds the substrate on a chuck table in a state in which the undersurface side of the substrate is exposed upward, and grinds the substrate by bringing a grinding stone moving in an annular orbit into contact with the undersurface side of the substrate. In order to protect the top surface side of the substrate at this time, a protective member in which a base material layer and a glue layer are laminated is affixed to the top surface of the substrate in advance.

The top surface side of the substrate is provided with devices, patterns constituting wiring, and the like. In addition, bumps serving as electrodes of the devices may be formed on the top surface side of the substrate in advance. Therefore, the various kinds of patterns, the bumps, and the like form projections and depressions on the top surface of the substrate. When the projections and depressions of the top surface of the substrate have a large height difference, the glue layer of the protective member does not sufficiently accommodate the projections and depressions, so that the fixation of the protective member becomes unstable. In addition, a surface on the base material layer side of the protective member does not become flat, so that the chuck table of the grinding apparatus does not uniformly support the substrate. Thus, the undersurface of the substrate does not become flat when the substrate is ground.

Further, a peripheral surplus region in which the devices are not formed on an outer circumferential portion of the substrate does not have patterns or bumps formed therein and is lower than a device formation region in which the devices are formed. Thus, the protective member cannot be sufficiently affixed to the outer circumferential portion of the substrate. Chipping therefore tends to occur at the outer circumference of the substrate when the substrate is ground. A protective member including a thick glue layer to be able to sufficiently accommodate the projections and depressions of the top surface of the substrate may be used. In this case, a residue of the glue layer tends to remain on the projections and depressions when the protective member is peeled off the substrate and becomes a cause of a defect in the device chips.

Accordingly, a protective member has been developed which is formed by supplying a liquid resin onto a sheet, placing the substrate on the sheet in a state in which the top surface side of the substrate is directed downward, pressing the substrate from above and thus making the liquid resin enter the projections and depressions of the substrate, and curing the liquid resin (see Japanese Patent Laid-Open No. 2017-50536, for example). When the protective member is formed on the top surface of the substrate, a film is disposed on the top surface of the substrate in advance. At this time, the film is adhered to the top surface of the substrate so as to conform to the projections and depressions of the top surface of the substrate. Incidentally, the film does not have the glue layer formed in at least a region adhering to the device formation region of the substrate, so that the glue layer is not in contact with the device formation region of the substrate. Here, when a film larger than the top surface of the substrate is used, at a time that the liquid resin spread toward the outside of the top surface of the substrate by pressing the substrate from above reaches the outside of the substrate, the liquid resin is held down by the film, so that the liquid resin does not go around to the undersurface side of the substrate. The formed protective member includes the film, the cured liquid resin, and the sheet. A surface on the sheet side is flat. When the protective member including the film is then removed from the top surface of the substrate after the substrate is ground, no residue of the liquid resin and the glue layer remains on the projections and depressions of the top surface of the substrate.

SUMMARY OF THE INVENTION

However, with the method that lowers the substrate to the sheet whose upper surface is supplied with the liquid resin when the protective member is formed on the top surface of the substrate, it is not easy to uniformly distribute the liquid resin over the whole of the top surface of the substrate. This is because when the top surface of the substrate presses the liquid resin, the projections and depressions of the top surface as a pressing surface hinder uniform spread of the liquid resin. Nonuniformity occurring in the liquid resin of the formed protective member presents a problem because the substrate is not properly supported on the chuck table of the grinding apparatus.

It is accordingly an object of the present invention to provide a protective member forming method and a protective member forming apparatus that, when forming a protective member including a cured liquid resin on the top surface of a substrate having projections and depressions on the top surface, can suppress occurrence of nonuniformity of the liquid resin.

In accordance with an aspect of the present invention, there is provided a protective member forming method for forming a protective member on a top surface of a substrate having projections and depressions on the top surface, the protective member forming method including a resin film adhering step of covering the top surface of the substrate with a resin film and adhering the resin film to the substrate so as to conform to the projections and depressions of the top surface of the substrate a liquid resin supply step of supplying a curable liquid resin to a region superimposed on the substrate on an upper surface of the resin film adhering to the substrate; a pressing step of covering the liquid resin supplied to the upper surface of the resin film with a cover film and spreading the liquid resin over the resin film by pressing the liquid resin by a flat pressing surface via the cover film; and a curing step of curing the liquid resin spread over the resin film in the pressing step and forming the protective member including the resin film, the cured liquid resin, and the cover film on the top surface of the substrate.

Preferably, the protective member forming method further includes an outer circumferential excess portion cutting step of cutting the protective member along an outer circumference of the substrate after the curing step is performed.

In addition, according to another aspect of the present invention, there is provided a protective member forming apparatus for forming a protective member on a top surface of a substrate having projections and depressions on the top surface, the protective member forming apparatus including: a resin film adhering unit including a substrate supporting portion supporting the substrate and an exhaust unit capable of exhausting a space formed by covering the substrate supported by the substrate supporting portion with a resin film, the resin film adhering unit being configured to exhaust and decompress the space by actuating the exhaust unit and adhere the resin film to the top surface so as to conform to the projections and depressions of the top surface of the substrate; a support table configured to support the substrate to which the resin film adheres in a state in which the resin film is exposed upward; a liquid resin supply unit including a nozzle that discharges a curable liquid resin and configured to supply the liquid resin from the nozzle onto an upper surface of the resin film adhering to the substrate supported by the support table; a pressing unit having a flat pressing surface and configured to spread the liquid resin over the resin film by pressing the liquid resin by the pressing surface via a cover film while covering the liquid resin supplied by the liquid resin supply unit with the cover film; and a curing unit configured to cure the liquid resin spread by the pressing unit and form the protective member including the resin film, the cured liquid resin, and the cover film on the top surface of the substrate.

Preferably, the protective member forming apparatus further includes a transfer unit configured to transfer the substrate to which the resin film adheres from the substrate supporting portion to the support table while the resin film remains in a spread state on an outside of the substrate, the transfer unit including a noncontact type suction pad configured to generate a negative pressure while jetting a fluid toward the top surface of the substrate, a suction pad configured to suck and hold the resin film on the outside of the substrate, a base portion to which the noncontact type suction pad and the suction pad are fixed, and a moving mechanism configured to move the base portion, the noncontact type suction pad and the suction pad being able to be actuated independently of each other.

In addition, preferably, the protective member forming apparatus further includes a cutting unit including a table configured to support the substrate having the protective member formed on the top surface, a cutting portion configured to cut the protective member, and a cutting portion moving unit configured to move the cutting portion along an outer circumference of the substrate, the cutting unit being capable of cutting the protective member along the outer circumference of the substrate by moving the cutting portion by the cutting portion moving unit along the outer circumference of the substrate supported by the table and having the protective member formed on the top surface.

According to yet another aspect of the present invention, there is provided a protective member forming method for using a protective member forming apparatus and forming a protective member on a top surface of a substrate having projections and depressions on the top surface, the protective member forming apparatus comprising: a resin film adhering unit including a substrate supporting portion supporting the substrate and an exhaust unit capable of exhausting a space formed by covering the substrate supported by the substrate supporting portion with a resin film, the resin film adhering unit being configured to exhaust and decompress the space by actuating the exhaust unit and adhere the resin film to the top surface so as to conform to the projections and depressions of the top surface of the substrate; a support table configured to support the substrate to which the resin film adheres, in a state in which the resin film is exposed upward; a liquid resin supply unit including a nozzle that discharges a curable liquid resin and configured to supply the liquid resin from the nozzle onto an upper surface of the resin film adhering to the substrate supported by the support table; a pressing unit having a flat pressing surface and configured to spread the liquid resin over the resin film by pressing the liquid resin by the pressing surface via a cover film while covering the liquid resin supplied by the liquid resin supply unit with the cover film; a curing unit configured to cure the liquid resin spread by the pressing unit and form the protective member including the resin film, the cured liquid resin, and the cover film on the top surface of the substrate; and a transfer unit configured to transfer the substrate to which the resin film adheres from the substrate supporting portion to the support table while the resin film remains in a spread state on an outside of the substrate; the transfer unit including a noncontact type suction pad configured to generate a negative pressure while jetting a fluid toward the top surface of the substrate, a suction pad configured to suck and hold the resin film on the outside of the substrate, a base portion to which the noncontact type suction pad and the suction pad are fixed, and a moving mechanism configured to move the base portion, the noncontact type suction pad and the suction pad being able to be actuated independently of each other; the protective member forming method including: a resin film adhering step of placing the substrate on the substrate supporting portion of the resin film adhering unit in a state in which the top surface of the substrate is directed upward, covering the top surface of the substrate with the resin film, and adhering the resin film to the substrate so as to conform to the projections and depressions of the top surface of the substrate; a first transfer step of transferring the substrate to which the resin film adheres from the substrate supporting portion of the resin film adhering unit to the support table by using the transfer unit; a liquid resin supply step of supplying the curable liquid resin to a region superimposed on the substrate on the upper surface of the resin film adhering to the substrate on the support table; a pressing step of covering the liquid resin supplied to the upper surface of the resin film with the cover film and spreading the liquid resin over the resin film by pressing the liquid resin by the flat pressing surface via the cover film; and a curing step of curing the liquid resin spread over the resin film in the pressing step and forming the protective member including the resin film, the cured liquid resin, and the cover film on the top surface of the substrate; the first transfer step sucking and holding the resin film by the suction pad in a region not superimposed on the substrate on the substrate supporting portion while sucking and holding the resin film by the noncontact type suction pad in the region superimposed on the substrate, then transferring the substrate to which the resin film adheres onto the support table by actuating the moving mechanism, releasing the sucking and holding of the resin film by the suction pad, and then releasing the sucking and holding of the resin film by the noncontact type suction pad.

Alternatively, according to yet another aspect of the present invention, there is provided a protective member forming method for using a protective member forming apparatus and forming the protective member on a top surface of a substrate having projections and depressions on the top surface, the protective member forming apparatus comprising: a resin film adhering unit including a substrate supporting portion supporting the substrate and an exhaust unit capable of exhausting a space formed by covering the substrate supported by the substrate supporting portion with a resin film, the resin film adhering unit being configured to exhaust and decompress the space by actuating the exhaust unit and adhere the resin film to the top surface so as to conform to the projections and depressions of the top surface of the substrate; a support table configured to support the substrate to which the resin film adheres, in a state in which the resin film is exposed upward; a liquid resin supply unit including a nozzle that discharges a curable liquid resin and configured to supply the liquid resin from the nozzle onto an upper surface of the resin film adhering to the substrate supported by the support table; a pressing unit having a flat pressing surface and configured to spread the liquid resin over the resin film by pressing the liquid resin by the pressing surface via a cover film while covering the liquid resin supplied by the liquid resin supply unit with the cover film; a curing unit configured to cure the liquid resin spread by the pressing unit and form the protective member including the resin film, the cured liquid resin, and the cover film on the top surface of the substrate; a transfer unit configured to transfer the substrate to which the resin film adheres from the substrate supporting portion to the support table while the resin film remains in a spread state on an outside of the substrate; and a cutting unit including a table configured to support the substrate having the protective member formed on the top surface, a cutting portion configured to cut the protective member, and a cutting portion moving unit configured to move the cutting portion along an outer circumference of the substrate, the cutting unit being capable of cutting the protective member along the outer circumference of the substrate by moving the cutting portion by the cutting portion moving unit along the outer circumference of the substrate supported by the table and having the protective member formed on the top surface; the transfer unit including a noncontact type suction pad configured to generate a negative pressure while jetting a fluid toward the top surface of the substrate, a suction pad configured to suck and hold the resin film on the outside of the substrate, a base portion to which the noncontact type suction pad and the suction pad are fixed, and a moving mechanism configured to move the base portion, the noncontact type suction pad and the suction pad being able to be actuated independently of each other; the protective member forming method including: a resin film adhering step of covering the top surface of the substrate with the resin film and adhering the resin film to the substrate so as to conform to the projections and depressions of the top surface of the substrate; a liquid resin supply step of supplying the curable liquid resin to a region superimposed on the substrate on the upper surface of the resin film adhering to the substrate; a pressing step of covering the liquid resin supplied to the upper surface of the resin film with the cover film and spreading the liquid resin over the resin film by pressing the liquid resin by the flat pressing surface via the cover film; a curing step of curing the liquid resin spread over the resin film in the pressing step on the support table and forming the protective member including the resin film, the cured liquid resin, and the cover film on the top surface of the substrate; a second transfer step of transferring the substrate having the protective member formed on the top surface from the support table to the table of the cutting unit by using the transfer unit; and an outer circumferential excess portion cutting step of cutting the protective member along the outer circumference of the substrate in the cutting unit; the second transfer step sucking and holding the resin film by the suction pad in a region not superimposed on the substrate on the support table while sucking and holding the cover film by the noncontact type suction pad in the region superimposed on the substrate, then transferring the substrate having the protective member formed on the top surface onto the table of the cutting unit by actuating the moving mechanism, releasing the sucking and holding of the resin film by the suction pad, and then releasing the sucking and holding of the cover film by the noncontact type suction pad.

In the protective member forming method and the protective member forming apparatus according to one aspect of the present invention, the top surface of the substrate having the projections and depressions on the top surface is covered with the resin film, and the resin film is adhered to the top surface of the substrate. Next, the curable liquid resin is supplied onto the resin film, the liquid resin is pressed by the flat pressing surface via the cover film, and the liquid resin is spread over the resin film. At this time, the direction of the pressing surface is set such that the pressing surface is parallel with the undersurface of the substrate, for example. Thereafter, the protective member including the resin film, the cured liquid resin, and the cover film is formed on the top surface of the substrate by curing the liquid resin.

In one aspect of the present invention, when the liquid resin is spread over the resin film, the liquid resin is pressed by the flat pressing surface from above. Therefore, unlike a case of pressing the liquid resin by the top surface of the substrate having the projections and depressions, the spread of the liquid resin is not hindered by the projections and depressions, the liquid resin spreads without gaps, and nonuniformity occurring in the liquid resin is suppressed. In this case, the top surface of the substrate is protected by the protective member properly, and the substrate is properly supported on the chuck table via the protective member when the undersurface side of the substrate is ground by a grinding apparatus. Thus, the substrate can be ground properly. Moreover, in one aspect of the present invention, when the liquid resin is pressed, the pressing surface is lowered from above instead of supporting and lowering the substrate from above. It is therefore not necessary to raise or lower the substrate in a state of not being supported from below. In a case where the liquid resin is pressed by lowering the substrate, for example, the substrate may fall off a raising and lowering mechanism that raises and lowers the substrate, and the substrate may be damaged. In one aspect of the present invention, on the other hand, the substrate is supported from below by the predetermined support table. Thus, the substrate is not damaged due to falling off or the like, and the substrate can be handled more stably.

Hence, according to one aspect of the present invention, a protective member forming method and a protective member forming apparatus are provided which, when forming a protective member including a cured liquid resin on the top surface of a substrate having projections and depressions on the top surface, can suppress occurrence of nonuniformity of the liquid resin.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
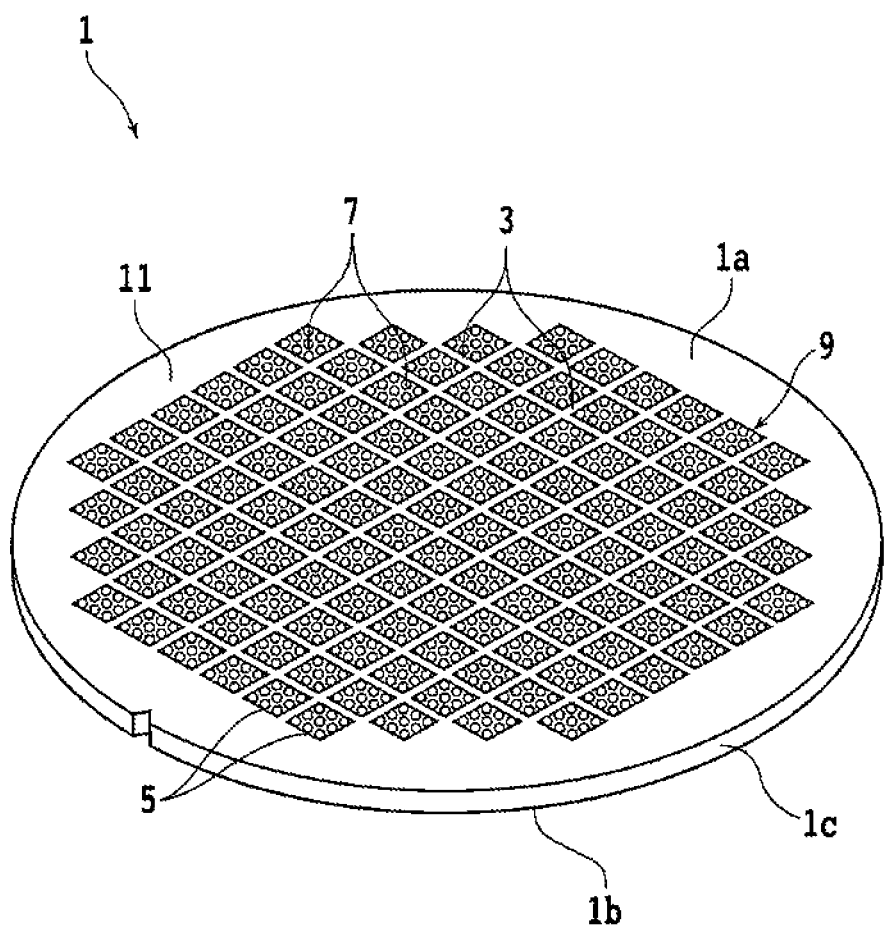
FIG. 1 is a perspective view schematically illustrating a substrate.

An embodiment according to one aspect of the present invention will be described with reference to the accompanying drawings. A protective member forming method and a protective member forming apparatus according to the present embodiment form a protective member on the top surface of a substrate such as a semiconductor wafer or the like which substrate has a plurality of devices formed on the top surface thereof. The substrate having the protective member formed on the top surface thereof will first be described. FIG. 1 is a perspective view schematically illustrating a substrate 1. The substrate 1 is, for example, a wafer formed of a material such as silicon (Si), silicon carbide (SiC), gallium nitride (GaN), gallium arsenide (GaAs), or another semiconductor. Alternatively, the substrate 1 is a substantially disk-shaped substrate or the like formed of a material such as sapphire, glass, or quartz. The glass is, for example, alkali glass, non-alkali glass, soda-lime glass, lead glass, borosilicate glass, quartz glass, or the like.

Figure 3A:
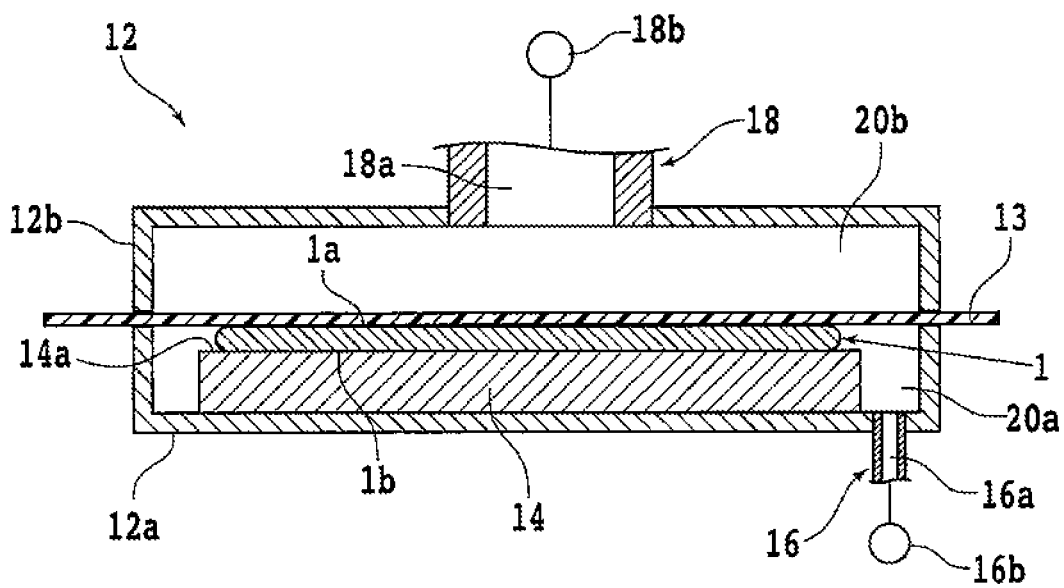
FIG. 3A is a sectional view schematically illustrating a resin film adhering unit.
Figure 3B:
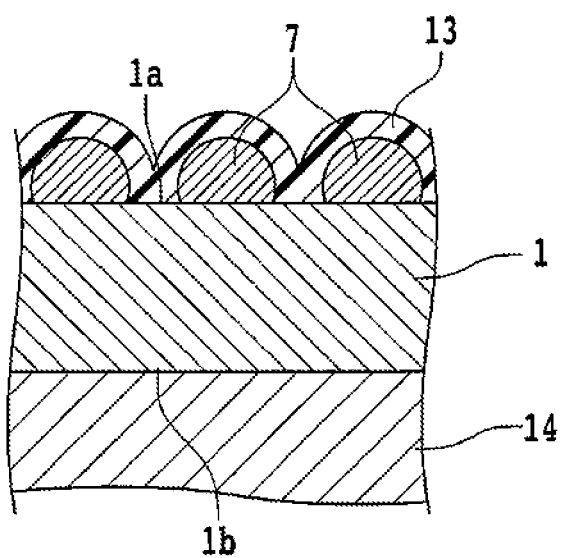
FIG. 3B is a sectional view schematically illustrating, in enlarged dimension, the substrate having a resin film adhering to a top surface thereof.

FIG. 1 schematically illustrates a perspective view of the substrate 1. FIG. 3A schematically illustrates a sectional view of the substrate 1. FIG. 3B schematically illustrates an enlarged sectional view of the substrate 1. A plurality of planned dividing lines 3 intersecting each other are set on a top surface 1a of the substrate 1. A device 5 such as an integrated circuit (IC) or large-scale integration (LSI) is formed in each region demarcated by the planned dividing lines 3. Individual device chips can be formed when the substrate 1 is divided along the planned dividing lines 3 by grinding the substrate 1 from an undersurface 1b side and thus thinning the substrate 1. A plurality of projecting portions referred to as bumps 7 formed of a metal are provided on the top surface 1a of the substrate 1. Each of the bumps 7 is electrically connected to the device 5 and functions as an electrode at a time of inputting or outputting an electric signal to the device 5 after the device chips are formed by dividing the substrate 1. The bumps 7 are, for example, formed of a metallic material such as gold, silver, copper, or aluminum. However, the bumps 7 may not necessarily be provided on the top surface 1a of the substrate 1.

A region on an outer circumferential side which region surrounds a region in which the plurality of devices 5 are formed on the top surface 1a of the substrate 1 is referred to as a peripheral surplus region 11. The peripheral surplus region 11 of the top surface 1a of the substrate 1 has no devices 5 formed therein and has no bumps 7 as the electrodes of the devices 5 formed therein either. The region surrounded by the peripheral surplus region 11 of the top surface 1a of the substrate 1 is referred to as a device formation region 9. The device formation region 9 of the top surface 1a of the substrate 1 is not flat and has projections and depressions resulting from each pattern constituting the devices 5 and the bumps 7. On the other hand, the peripheral surplus region 11 of the top surface 1a is flat.

It is to be noted that the substrate 1 on which the protective member is formed is not limited to this. For example, the substrate 1 on which the protective member is formed may be a package substrate formed by sealing a plurality of devices arranged on a flat surface with a sealing resin. Individual device chips having a predetermined thickness which device chips are sealed by the sealing resin can be formed when the package substrate is thinned by grinding the sealing resin on the undersurface side of the package substrate and the package substrate is thus divided on a device-by-device basis. Bumps serving as electrodes of individual devices are formed on the top surface of the package substrate. Thus, the top surface of the package substrate, also, is not flat and has projections and depressions.

When the substrate 1 is thinned by grinding the substrate 1 from the undersurface 1b side by a grinding apparatus and the substrate 1 is thus divided, device chips thinned to a predetermined thickness are obtained. A protective member is affixed to the top surface 1a side in advance in order to protect the top surface 1a side when the substrate 1 is ground from the undersurface 1b side. Conventionally, in a case where the projections and depressions of the top surface 1a of the substrate 1 are small, a protective member in the form of a tape obtained by laminating a base material layer and a glue layer is affixed to the top surface 1a of the substrate 1. An exposed surface on the base material layer side of the protective member affixed to the substrate 1 is flat, and the substrate 1 is properly supported on a support table when the substrate 1 is carried into the grinding apparatus. However, when the projections and depressions on the top surface 1a side of the substrate 1 become large, the glue layer of the protective member is unable to accommodate the projections and depressions sufficiently, and the exposed surface on the base material layer side of the protective member affixed to the substrate 1 is not flat. In this case, the support table does not support the substrate 1 properly when the substrate 1 is carried into the grinding apparatus, and the undersurface 1b of the substrate 1 is not flat when the substrate 1 is ground from the undersurface 1b side. Accordingly, the protective member forming method and the protective member forming apparatus according to the present embodiment form a protective member by supplying a liquid resin onto the top surface 1a of the substrate 1 and curing the liquid resin.

Figure 2:
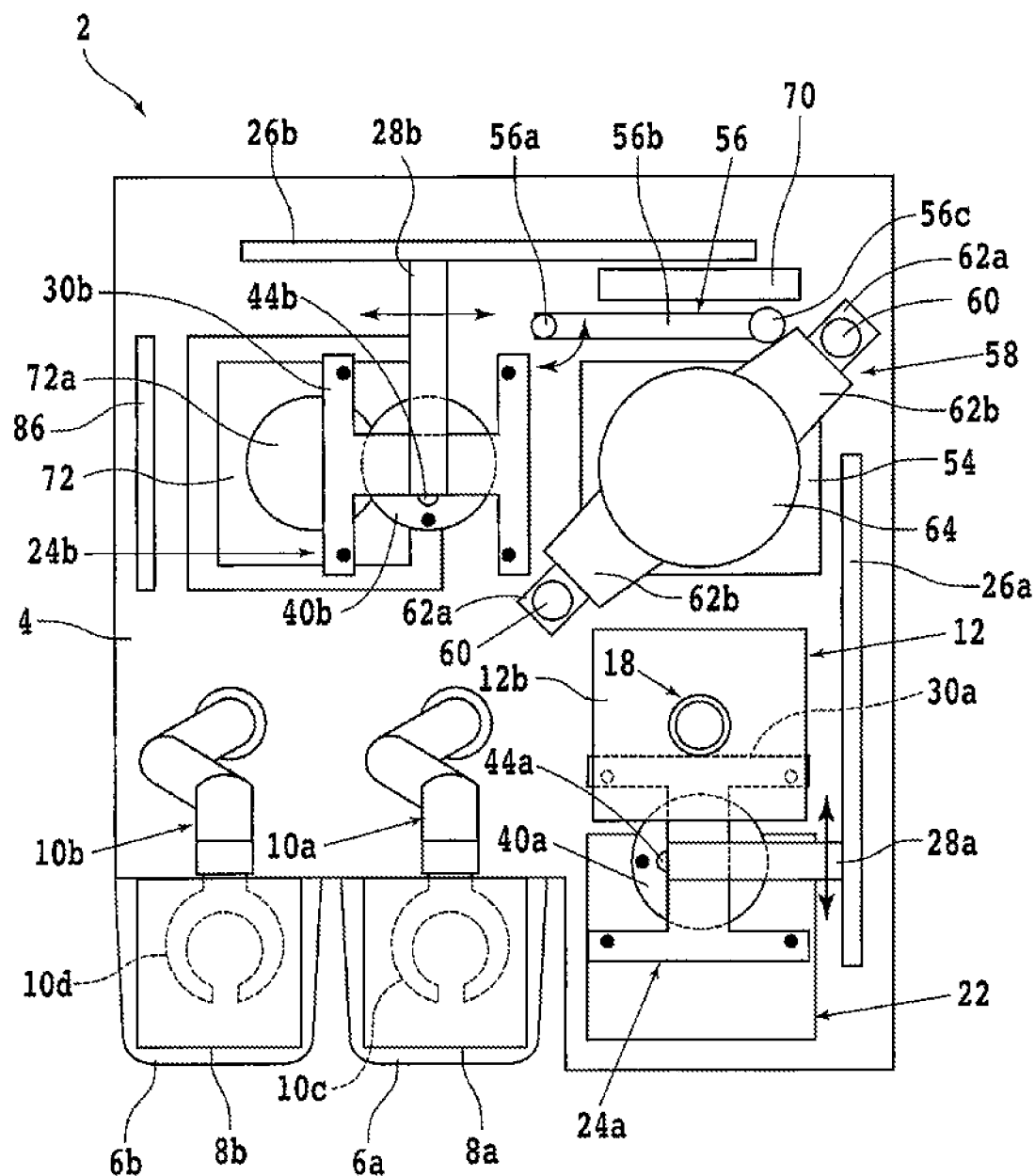
FIG. 2 is a top view schematically illustrating a protective member forming apparatus.

The protective member forming apparatus according to the present embodiment will be described in the following. FIG. 2 is a top view schematically illustrating a protective member forming apparatus 2. The protective member forming apparatus 2 includes a base 4 supporting constituent elements. An end portion of the base 4 is provided with cassette mounting bases 6a and 6b mounted with cassettes 8a and 8b housing a plurality of substrates 1. A substrate 1 before a protective member is formed is, for example, housed in the cassette 8a placed on the cassette mounting base 6a and carried into the protective member forming apparatus 2. Then, the substrate 1 having the protective member formed on the top surface 1a in the protective member forming apparatus 2 is, for example, housed in the cassette 8b placed on the cassette mounting base 6b.

A substrate transfer robot 10a is provided at a position adjacent to the cassette mounting base 6a on the base 4. A substrate transfer robot 10b is provided at a position adjacent to the cassette mounting base 6b. The substrate transfer robots 10a and 10b are, for example, an articulated robot having a plurality of arm portions connected to each other so as to be continuously rotatable on mutual end portions. Substrate holding portions 10c and 10d that can hold a substrate 1 are provided at distal ends of arm portions on a most distal end side. The substrate holding portions 10c and 10d can be moved when the arm portions are rotated with respect to each other. The substrate holding portions 10c and 10d of the substrate transfer robots 10a and 10b are inserted into the cassettes 8a and 8b placed on the cassette mounting bases 6a and 6b and carry substrates 1 into and out of the cassettes 8a and 8b. Here, the substrate transfer robots 10a and 10b include shaft portions erected on the base 4 and supporting the arm portions; and raising and lowering mechanisms that raise and lower the shaft portions. The raising and lowering mechanisms raise and lower the substrate holding portions 10c and 10d together with the shaft portions such that the substrate holding portions 10c and 10d coincide with the height of a cassette housing region into and out of which a substrate 1 is to be carried among a plurality of stacked cassette housing regions included in the cassettes 8a and 8b.

The substrate transfer robot 10a has a function of transferring a substrate 1 housed in the cassette 8a mounted on the cassette mounting base 6a to a resin film adhering unit 12 to be described next. FIG. 3A is a sectional view schematically illustrating an example of the resin film adhering unit 12. The resin film adhering unit 12 is, for example, a unit in the form of a chamber internally having a space capable of housing the substrate 1. The resin film adhering unit 12 has a function of adhering a resin film 13 to the top surface 1a of the substrate 1. Here, the resin film 13 is, for example, a polyolefin-based sheet, a polyethylene-based sheet, or the like, may be a single layer or laminated, and has a thickness equal to or more than 20 μm and equal to or less than 80 μm. The resin film adhering unit 12 has a hollow-shaped lower main body 12a opening upward and a hollow-shaped upper main body 12b disposed over the lower main body 12a and opening downward. The upper main body 12b can be raised and lowered. The opening of the lower main body 12a and the opening of the upper main body 12b are of the same shape. When the upper main body 12b is lowered to the lower main body 12a such that the openings coincide with each other, a space isolated from the outside can be formed within the upper main body 12b and the lower main body 12a. Incidentally, each of the openings is larger than the substrate 1, and the substrate 1 can be housed within the space.

The lower main body 12a is provided with a table-shaped substrate supporting portion 14 supporting the substrate 1. The upper surface of the substrate supporting portion 14 is a flat supporting surface 14a that supports the substrate 1. The height of the substrate supporting portion 14 is adjusted such that the top surface 1a of the substrate 1 and the opening of the lower main body 12a are substantially at the same height when the substrate 1 is placed on the supporting surface 14a. Alternatively, the height of the substrate supporting portion 14 is adjusted such that the opening of the lower main body 12a is higher than the top surface 1a of the substrate 1. In these cases, when the resin film 13 is placed on the lower main body 12a and adhered to the substrate 1 as described later, the resin film 13 does not adhere to the side surface of the substrate 1 unnecessarily widely. An exhaust unit 16 is connected to a bottom wall or a side wall of the lower main body 12a. The exhaust unit 16 includes an exhaust passage 16a having one end connected to the lower main body 12a and having another end connected to a suction source 16b. In addition, an exhaust unit 18 is connected to a ceiling or a side wall of the upper main body 12b. The exhaust unit 18 includes an exhaust passage 18a having one end connected to the upper main body 12b and having another end connected to a suction source 18b.

At a time of adhering the resin film 13 to the top surface 1a of the substrate 1 by using the resin film adhering unit 12, the substrate 1 is loaded onto the substrate supporting portion 14, the substrate supporting portion 14 is made to support the substrate 1, and thereafter, the top surface 1a of the substrate 1 is covered by the resin film 13. A resin film supplying unit 22 in which a plurality of resin films 13 are prepared is provided at a position adjacent to the resin film adhering unit 12 on the base 4 of the protective member forming apparatus 2. A transfer unit 24a to be described later transfers a resin film 13 for covering the substrate 1 from the resin film supplying unit 22. Resin films 13 larger than the opening of the lower main body 12a are prepared in the resin film supplying unit 22 so that a space 20a closed by the lower main body 12a and the resin film 13 can be formed when the resin film 13 is transferred onto the substrate 1. Then, after the resin film 13 is transferred onto the substrate 1, the upper main body 12b is brought into contact with the upper surface of the resin film 13 by lowering the upper main body 12b. Then, a space 20b closed by the upper main body 12b and the resin film 13 is formed.

Thus, when the resin film 13 is adhered to the substrate 1, the inside of the resin film adhering unit 12 in the form of a chamber is divided into the upper space 20b and the lower space 20a by the resin film 13. Then, when the suction source 16b of the exhaust unit 16 is actuated and the suction source 18b of the exhaust unit 18 is actuated, the space 20a and the space 20b can be exhausted and decompressed. Thereafter, only the suction source 18b decompressing the space 20b is stopped, and the space 20b is opened to the atmosphere. As a result, a large pressure difference momentarily occurs between the space 20a and the space 20b with the resin film 13 interposed therebetween. This pressure difference then causes the resin film 13 to adhere to the top surface 1a so as to conform to the projections and depressions of the top surface 1a of the substrate 1. FIG. 3B is a sectional view schematically illustrating, in enlarged dimension, the substrate 1 having the resin film 13 adhering to the top surface 1a. The resin film 13 can be adhered to the top surface 1a of the substrate 1 when the resin film adhering unit 12 is used as described above. After the resin film 13 is adhered to the substrate 1, the exhaust unit 16 is stopped, and the upper main body 12b is raised.

Incidentally, a heating unit not illustrated which can supply a heated gas may be connected to the ceiling or the side wall of the upper main body 12b. The heating unit has a function of supplying the heated gas to the space 20b of the upper main body 12b. The gas is, for example, air, nitrogen gas, or the like. In a case where a material whose flexibility is enhanced by heating is used as the resin film 13, for example, when the heated gas is supplied to the space 20b, the gas increases the temperature of the resin film 13 and thus softens the resin film 13. When the resin film 13 is softened, the resin film 13 is easily deformed so as to follow the shape of the top surface 1a of the substrate 1, and the resin film 13 adheres to the top surface 1a of the substrate 1 easily. For example, before the space 20a and the space 20b are decompressed, the heating unit may supply the heated gas to the space 20b to heat and soften the resin film 13 in advance. Alternatively, the heating unit may be actuated to heat the resin film 13 and promote deformation of the resin film 13 after the space 20a and the space 20b are decompressed and the space 20b is opened to the atmosphere.

The protective member forming apparatus 2 includes a support table 54 at a position adjacent to the resin film adhering unit 12 on the base 4. The transfer unit 24a transfers the substrate 1 to which the resin film 13 adheres from the resin film adhering unit 12 to the support table 54. In an apparatus configuration illustrated in FIG. 2, the resin film supplying unit 22, the resin film adhering unit 12, and the support table 54 are arranged next to each other linearly. The transfer unit 24a has a function of transferring the resin film 13 from the resin film supplying unit 22 to the resin film adhering unit 12. The transfer unit 24a has another function of transferring the substrate 1 to which the resin film 13 adheres from the substrate supporting portion 14 to the support table 54 while the resin film 13 remains in a spread state on the outside of the substrate 1.

Figure 4A:
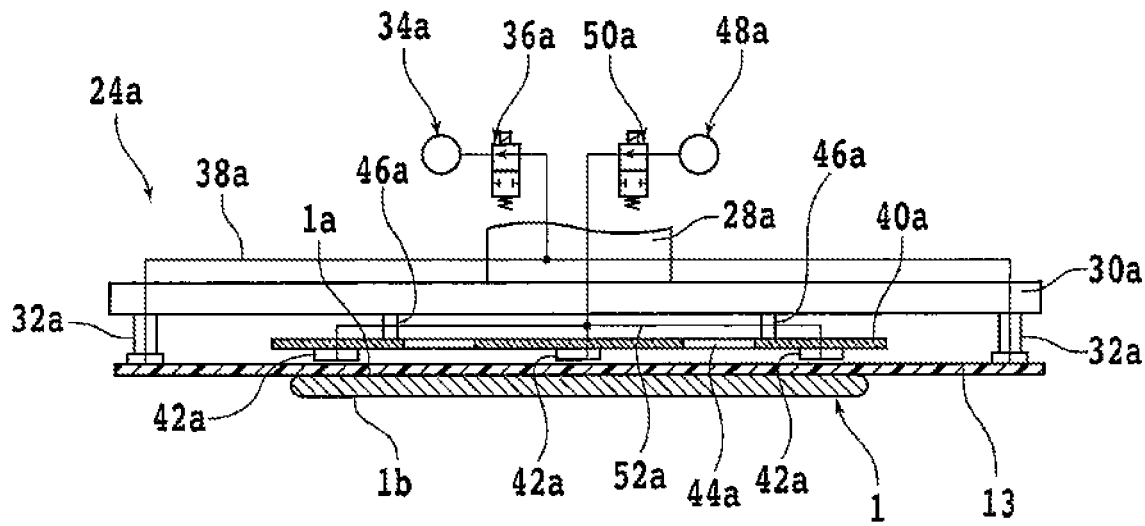
FIG. 4A is a sectional view schematically illustrating the substrate held by a transfer unit.
Figure 4B:
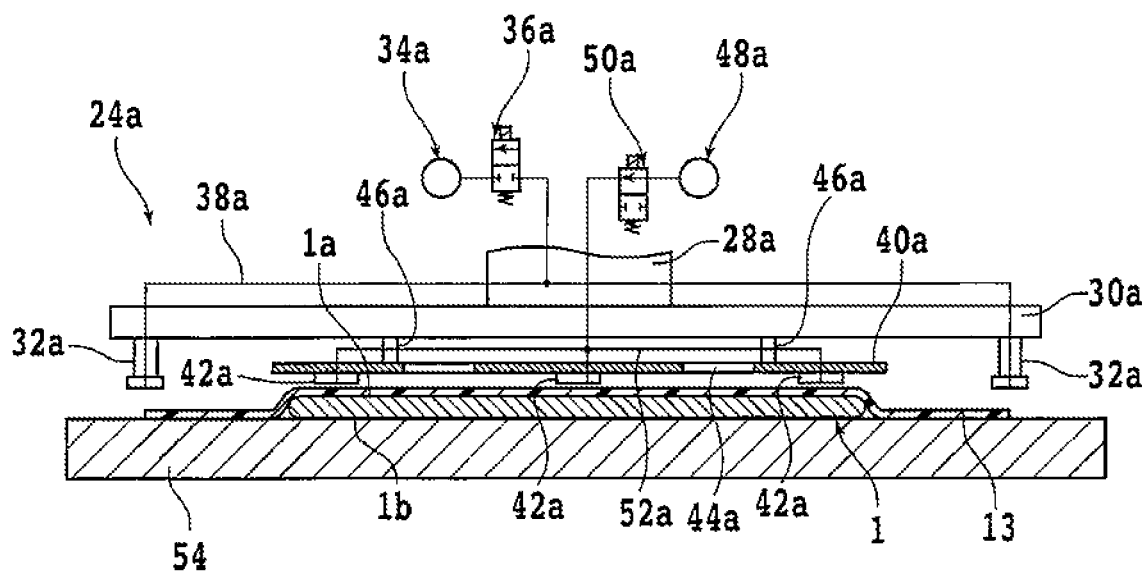
FIG. 4B is a sectional view schematically illustrating a state of having released the sucking and holding of the resin film by suction pads of the transfer unit that has transferred the substrate onto a support table.
Figure 5A:
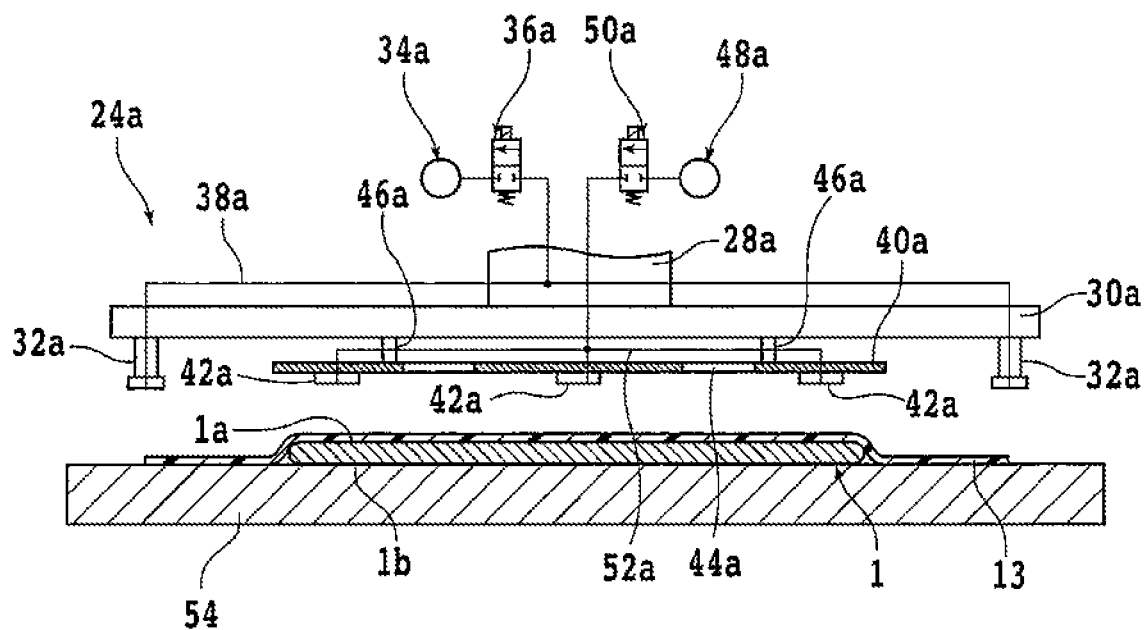
FIG. 5A is a sectional view schematically illustrating a state of having released the sucking and holding of the resin film by noncontact type suction pads of the transfer unit.

FIG. 2 schematically illustrates a top view of the transfer unit 24a. In addition, FIG. 4A, FIG. 4B, and FIG. 5A schematically illustrate side views of the transfer unit 24a. The transfer unit 24a includes a guide rail 26a along a direction in which the resin film adhering unit 12 and the support table 54 are arranged and an arm portion 28a slidably fitted to the guide rail 26a. The transfer unit 24a includes a moving mechanism (not illustrated) that moves the arm portion 28a along the guide rail 26a. The moving mechanism, for example, includes a ball screw (not illustrated) along the guide rail 26a and a pulse motor (not illustrated) that rotates the ball screw. A proximal end side of the arm portion 28a is provided with a nut portion (not illustrated) screwed onto the ball screw. When the ball screw is rotated by the pulse motor, the arm portion 28a moves along the guide rail 26a. A base portion 30a is fixed to a distal end side of the arm portion 28a. The moving mechanism moves the base portion 30a together with the arm portion 28a.

A plate-shaped noncontact type suction pad supporting portion 40a is fixed to the central lower surface of the base portion 30a via a plurality of columnar supporting portions 46a. Sectional views of the noncontact type suction pad supporting portion 40a are illustrated in FIG. 4A and the like. A through hole 44a is formed in the noncontact type suction pad supporting portion 40a. A plurality of noncontact type suction pads 42a are provided to the lower surface of the noncontact type suction pad supporting portion 40a. The plurality of noncontact type suction pads 42a are fixed to the base portion 30a via the noncontact type suction pad supporting portion 40a and the supporting portions 46a. The plurality of noncontact type suction pads 42a are each arranged on the lower surface of the noncontact type suction pad supporting portion 40a so as to be able to face the resin film 13 adhering to the top surface 1a of the substrate 1 in a region superimposed on the substrate 1. In addition, a plurality of suction pads 32a are fixed to the lower surface of an outer circumferential portion of the base portion 30a. The plurality of suction pads 32a are each arranged on the lower surface of the base portion 30a so as to be able to face the resin film 13 on the outside of the substrate 1.

Here, the lower surfaces of the plurality of suction pads 32a are at a uniform height, and the lower surfaces of the plurality of noncontact type suction pads 42a are at a uniform height. The height of the lower surfaces of the suction pads 32a is at a position slightly lower than the height of the lower surfaces of the plurality of noncontact type suction pads 42a. The lower surfaces of the suction pads 32a and the noncontact type suction pads 42a serve as suction surfaces that can suck and hold the resin film 13 adhering to the substrate 1.

The transfer unit 24a includes a suction passage 38a having one end reaching the lower surface of each of the suction pads 32a and having another end connected to a suction source 34a. The suction passage 38a is provided with a switching unit 36a. The switching unit 36a has a function of switching between a blocking state and a ventilating state in the suction passage 38a. When the switching unit 36a is set in the ventilating state, the suction source 34a acts to generate a negative pressure in the lower surfaces of the suction pads 32a. In addition, the transfer unit 24a includes an air supply passage 52a having one end reaching the lower surface of each of the noncontact type suction pads 42a and having another end connected to an air supply source 48a. The air supply passage 52a is provided with a switching unit 50a. The switching unit 50a has a function of switching between a blocking state and a ventilating state in the air supply passage 52a. When the switching unit 50a is set in the ventilating state, the air supply source 48a acts to jet gas from the lower surfaces of the noncontact type suction pads 42a.

Here, the lower surfaces of the noncontact type suction pads 42a are provided with a plurality of jetting ports not illustrated. The gas supplied to the noncontact type suction pads 42a through the air supply passage 52a is jetted from the jetting ports. The jetting ports are not directed in a completely downward direction but are directed in directions inclined from the completely downward direction to the outsides of the respective noncontact type suction pads 42a. The gas is jetted in the directions from the jetting ports. When a suction target object is positioned below the noncontact type suction pads 42a with a slight gap made therebetween and the gas is jetted from each of the jetting ports by setting the switching unit 50a in the ventilating state, the jetted gas travels toward the outsides of the noncontact type suction pads 42a. Then, a part of the gas escapes upward through the through hole 44a of the noncontact type suction pad supporting portion 40a. The gas jetted from the jetting ports of the noncontact type suction pads 42a travels while entraining surrounding air. Thus, a negative pressure occurs at central lower portions of the noncontact type suction pads 42*a*. The suction target is sucked and held by the noncontact type suction pads 42*a* due to the negative pressure. However, at this time, the noncontact type suction pads 42*a* are not in contact with the suction target.

In a case where a contact type suction pad is used in place of the noncontact type suction pads 42*a*, for example, the suction pad and the resin film 13 come into contact with each other. In this case, there is a fear that a contact trace of the suction pad is formed on the upper surface of the resin film 13, or there is a fear that particulates or the like as a contamination source adhering to the lower surface of the suction pad may be transferred to the resin film 13, so that appropriate formation of the protective member may be hindered. In addition, the upper surface of the resin film 13 adhering to the top surface 1*a* of the substrate 1 has an uneven shape. Thus, even when the contact type suction pad is brought into contact with the resin film 13, gaps resulting from the uneven shape occur between the suction pad and the resin film 13, and the negative pressure leaks. The contact type suction pad is therefore unable to suck and hold the resin film 13 properly. In contrast, such problems do not occur in the case where the noncontact type suction pads 42*a* suck and hold the resin film 13 adhering to the substrate 1. On the other hand, the protective member does not need to be formed with high accuracy on the outside of the substrate 1. The suction pads 32*a* sucking and holding the outer circumferential portion of the resin film 13 may therefore be of the noncontact type or the contact type.

When the transfer unit 24*a* transfers the substrate 1 to which the resin film 13 adheres from the substrate supporting portion 14 to the support table 54, the upper main body 12*b* of the resin film adhering unit 12 is raised, and the base portion 30*a* is moved to a position above the substrate supporting portion 14. Here, the transfer unit 24*a* includes a raising and lowering mechanism not illustrated which raises and lowers the base portion 30*a*. Next, the raising and lowering mechanism is actuated to lower the base portion 30*a* toward the substrate 1 supported by the substrate supporting portion 14. The base portion 30*a* is then positioned at a height such that the lower surfaces of the suction pads 32*a* are in contact with the resin film 13 and such that the noncontact type suction pads 42*a* can suck the resin film 13. The switching units 36*a* and 50*a* are thereafter actuated to suck the outer circumferential portion of the resin film 13 by the suction pads 32*a* and suck the substrate 1 by the noncontact type suction pads 42*a* via the resin film 13. The raising and lowering mechanism is then actuated to lift the substrate 1 by the transfer unit 24*a*.

The moving mechanism of the transfer unit 24*a* is thereafter actuated to move the base portion 30*a* to a position above the support table 54. FIG. 4A is a sectional view schematically illustrating a state in which the substrate 1 is being transferred by the transfer unit 24*a*. After the base portion 30*a* is moved to the position above the support table 54, the raising and lowering mechanism is actuated to place the substrate 1 on the support table 54. Thereafter, first, only the switching unit 36*a* is actuated and set in the blocking state, so that the suction of the resin film 13 by the suction pads 32*a* is released.

FIG. 4B is a sectional view schematically illustrating the transfer unit 24*a* and the substrate 1 in a state in which the suction of the resin film 13 by the suction pads 32*a* is released. When the suction of the resin film 13 by the suction pads 32*a* is released, the resin film 13 falls to the upper surface of the support table 54. At this time, the gas continues to be ejected from the noncontact type suction pads 42*a*, and the gas travels over the upper surface of the resin film 13 to the outside of the support table 54. Therefore, when the suction of the resin film 13 by the suction pads 32*a* is released, a force directed in an outward direction is applied to the resin film 13 due to the flow of the gas. When the resin film 13 is bent or wrinkled in a part not adhering to the substrate 1, for example, the flow of the gas straightens the resin film 13 and removes the bend or the wrinkle. When the suction of the resin film 13 by the noncontact type suction pads 42*a* is thereafter released, the substrate 1 is placed on the support table 54 in a state in which the resin film 13 is spread.

The suction by all of the pads may be released simultaneously in order to complete the transfer of the resin film 13 quickly, for example. However, even when the resin film 13 is bent or wrinkled at a time of releasing the suction of the resin film 13 in this case, the flow of the gas is stopped, and therefore, the bend or the like is not removed. When the substrate 1 is placed on the support table 54 in a state in which the resin film 13 is bent or wrinkled, there is a fear of being unable to normally perform steps to be performed subsequently and being unable to form the protective member on the top surface 1*a* of the substrate 1 properly. On the other hand, the transfer unit 24*a* of the protective member forming apparatus 2 according to the present embodiment allows each of the suction pads 32*a* and the noncontact type suction pads 42*a* to be actuated independently. The suction of the resin film 13 by each pad can therefore be sequentially released with a time lag provided. Hence, it is possible to suppress the occurrence of a bend or a wrinkle in the resin film 13 when transferring the substrate 1 to the support table 54 and suppress defective formation of the protective member due to the bend or the wrinkle in the resin film 13.

FIG. 5A is a sectional view schematically illustrating a state in which the sucking and holding of the substrate 1 by the transfer unit 24*a* is released and the base portion 30*a* is raised by the raising and lowering mechanism. A liquid resin is supplied to the top surface 1*a* side of the substrate 1 on the support table 54 with the resin film 13 interposed between the liquid resin and the top surface 1*a* side of the substrate 1, the liquid resin is spread over the resin film 13 by being pressed from above, and the liquid resin is cured.

Figure 5B:
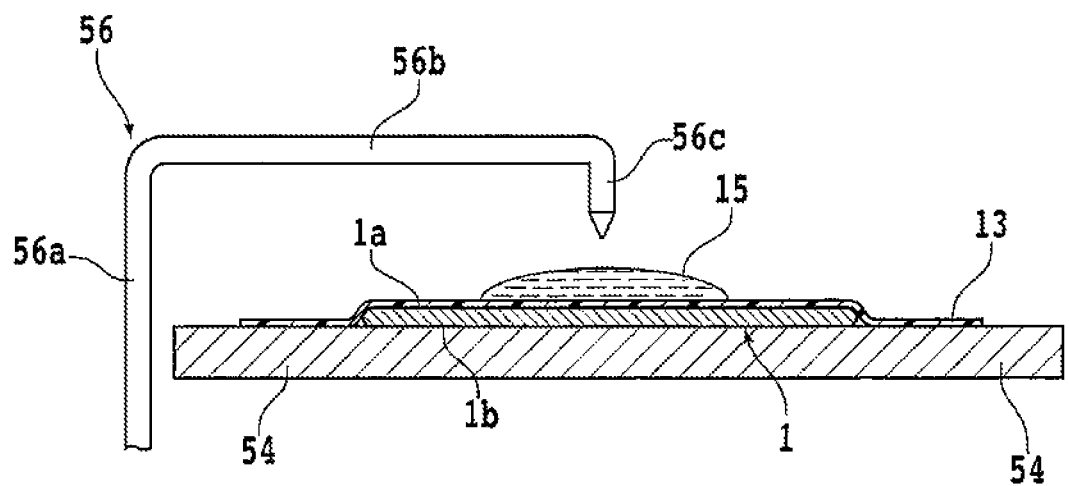
FIG. 5B is a sectional view schematically illustrating the substrate with a liquid resin supplied to the upper surface of the resin film.

A liquid resin supply unit 56 is provided at a position adjacent to the support table 54 on the base 4 of the protective member forming apparatus 2. The liquid resin supply unit 56 is a pipe-shaped unit including a shaft portion 56*a* extending along a vertical direction, an arm portion 56*b* extending in a horizontal direction from an upper end of the shaft portion 56*a*, and a nozzle 56*c* oriented downward from a distal end of the arm portion 56*b*. The shaft portion 56*a* is rotatable in the vertical direction. When the shaft portion 56*a* is rotated, the nozzle 56*c* moves in an arcuate orbit with the arm portion 56*b* as a radius. The length of the arm portion 56*b* is set to a length such that the nozzle 56*c* can be positioned above the center of the support table 54 by rotating the shaft portion 56*a*. The liquid resin supply unit 56 has a function of supplying a curable liquid resin onto the substrate 1 placed on the support table 54 through the shaft portion 56*a*, the arm portion 56*b*, and the nozzle 56*c*. The curable liquid resin is, for example, an ultraviolet curing resin curable by being irradiated with ultraviolet rays, a thermosetting resin curable by heating, or the like. FIG. 5B schematically illustrates a sectional view of the liquid resin supplied onto the resin film 13 adhering to the substrate 1.

When a curable liquid resin 15 is supplied to the upper surface of the resin film 13, the nozzle 56*c* is positioned above the center of the support table 54 by rotating the shaft portion 56a. Then, after the liquid resin 15 is supplied to the top surface 1a of the substrate 1, the nozzle 56c is positioned at a position not overlapping the support table 54 by rotating the shaft portion 56a again.

Figure 6:
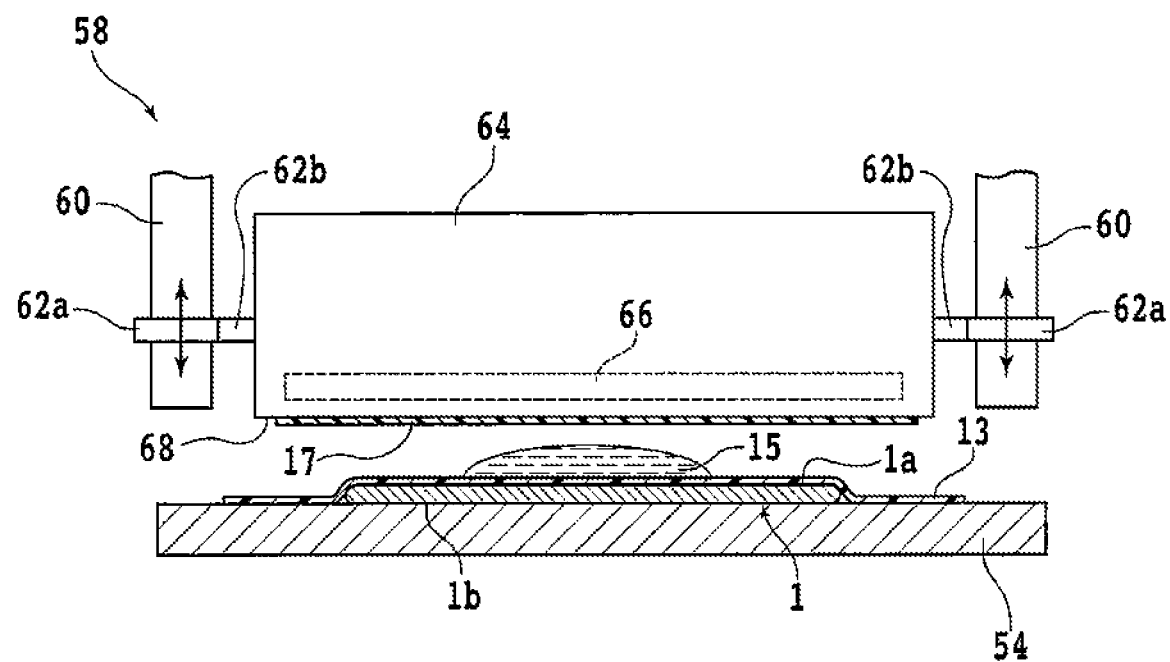
FIG. 6 is a side view schematically illustrating the substrate to which the resin film adheres, the liquid resin, and a pressing unit.
Figure 7A:
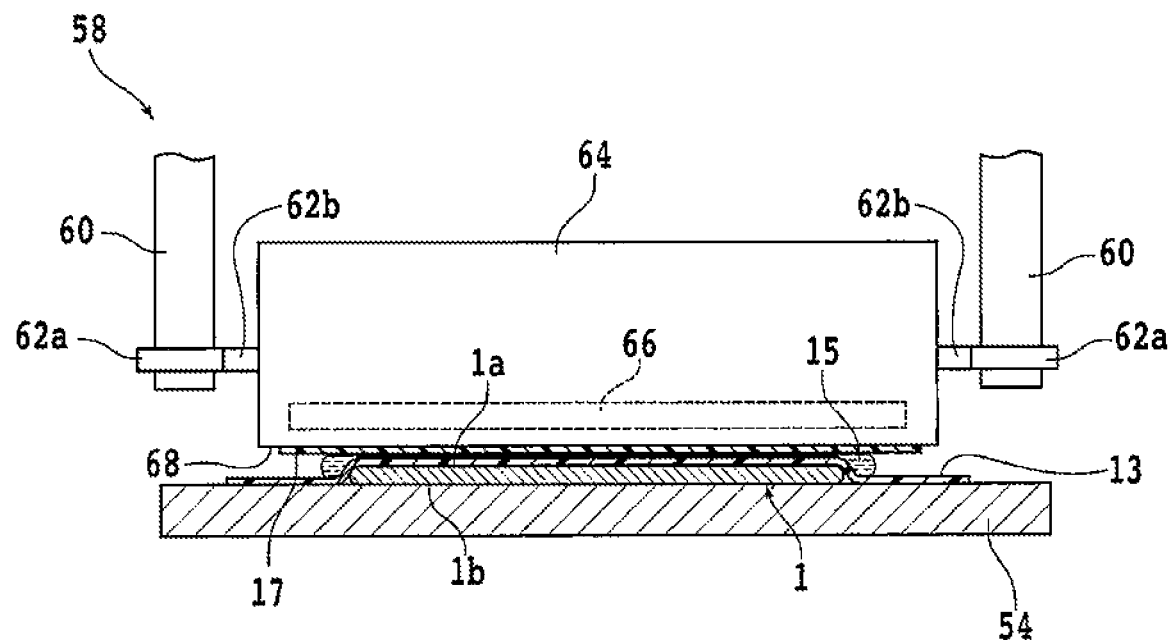
FIG. 7A is a side view schematically illustrating a state in which the pressing unit presses the liquid resin.

A pressing unit 58 is disposed over the support table 54. FIG. 2 schematically illustrates a top view of the pressing unit 58. FIG. 6 and FIG. 7A schematically illustrate side views of the pressing unit 58. The pressing unit 58 includes: a pair of supporting columns 60 along the vertical direction; connecting portions 62a slidably arranged on the respective supporting columns 60; a pair of supporting portions 62b extending in the horizontal direction from the respective connecting portions 62a; and a pressing portion 64 supported by the pair of supporting portions 62b. The connecting portions 62a can be raised and lowered along the supporting columns 60 by a raising and lowering mechanism not illustrated. The pressing portion 64 can be raised and lowered by using the raising and lowering mechanism. The pressing portion 64 has a flat pressing surface 68 as a lower surface thereof. The direction of the pressing surface 68 is set with high accuracy such that the pressing surface 68 is parallel with the upper surface of the support table 54. The pressing portion 64 internally has a curing unit 66 in proximity to the pressing surface 68.

In a case where the liquid resin 15 is an ultraviolet curing resin, for example, an ultraviolet irradiating unit in which a plurality of ultraviolet light-emitting diodes (LEDs) are annularly arranged side by side is prepared as the curing unit 66, and a member that transmits ultraviolet rays is used as a lower end of the pressing portion 64 which lower end constitutes the pressing surface 68. In addition, in a case where the liquid resin 15 is a thermosetting resin, for example, a heating unit such as a heater or the like is prepared as the curing unit 66. In the following, description will be made by taking as an example a case where the liquid resin 15 is formed by an ultraviolet curing resin and the curing unit 66 is an ultraviolet irradiating unit.

The pressing portion 64 can hold a cover film 17 by the pressing surface 68. The pressing unit 58 lowers the pressing portion 64 in a state of holding the cover film 17 by the pressing surface 68 and presses the liquid resin 15 by the pressing surface 68 via the cover film 17 from above. When the liquid resin 15 is thereafter cured by the curing unit 66, the resin film 13, the cured liquid resin 15, and the cover film 17 are integrated with each other to form a protective member. That is, the cover film 17 is a member constituting the protective member.

As illustrated in FIG. 2, a cover film supply unit 70 that supplies the cover film 17 to be held by the pressing surface 68 of the pressing portion 64 is disposed at a position adjacent to the support table 54. For example, a plurality of cover films 17 are wound in a roll shape and prepared in the cover film supply unit 70 and are drawn out onto the support table 54 one by one as required. Then, the pressing surface 68 is brought into contact with the upper surface of a cover film 17 by lowering the pressing portion 64, and the cover film 17 is held by the pressing surface 68.

Here, the pressing portion 64 includes a holding mechanism not illustrated for holding the cover film 17 by the pressing surface 68. For example, the pressing surface 68 is provided with a plurality of suction holes connected to a suction source, and the cover film 17 is held by the pressing surface 68 by sucking the cover film 17 from the suction holes. Alternatively, the pressing portion 64 may have an electrostatic chuck mechanism in the vicinity of the pressing surface 68, and the electrostatic chuck mechanism may be actuated to hold the cover film 17 by the pressing surface 68 through an electrostatic force. Alternatively, the pressing portion 64 may have no holding mechanism. In this case, for example, a glue layer may be provided to the upper surface of the cover film 17, and the cover film 17 may be bonded to the pressing surface 68 by the glue layer. Alternatively, the upper surface of the cover film 17 or the pressing surface 68 may be coated with an adhesive, and the cover film 17 may be held by the pressing surface 68 through the adhesive.

Over the support table 54, after the liquid resin supply unit 56 supplies the liquid resin 15 onto the resin film 13, the pressing unit 58 holding the cover film 17 by the pressing surface 68 is lowered, and the pressing surface 68 presses the liquid resin 15 via the cover film 17. FIG. 7A schematically illustrates a sectional view of the substrate 1, the resin film 13, the liquid resin 15, and the cover film 17 when the liquid resin 15 is pressed by the pressing surface 68. When the liquid resin 15 is pressed by the pressing surface 68, the liquid resin 15 is spread toward the outer circumference of the substrate 1. In other words, the pressing unit 58 has a function of spreading the liquid resin 15 over the resin film 13 by pressing the liquid resin 15 by the pressing surface 68 via the cover film 17 while covering an upper part of the liquid resin 15 supplied by the liquid resin supply unit 56 with the cover film 17.

Figure 7B:
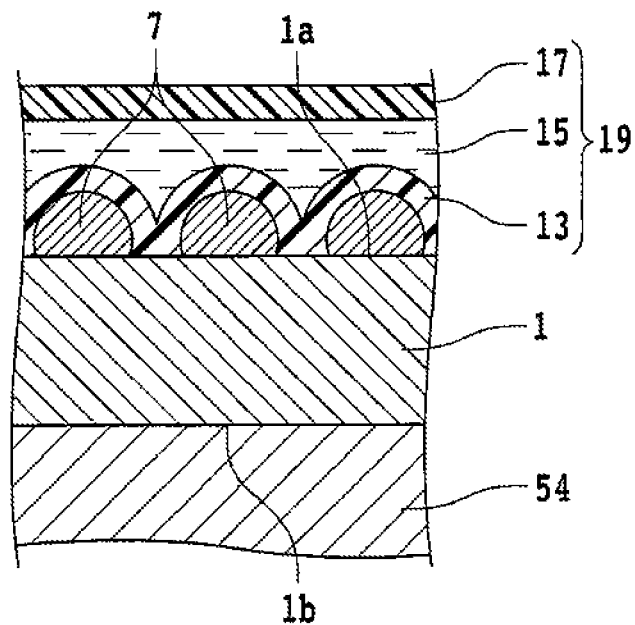
FIG. 7B is a sectional view schematically illustrating a protective member formed on the top surface of the substrate.

The curing unit 66 cures the liquid resin 15 after the liquid resin 15 is spread toward the outer circumference of the substrate 1 and an entire area of the top surface 1a of the substrate 1 is covered by the resin film 13, the liquid resin 15, and the cover film 17. For example, the curing unit 66 cures the liquid resin 15 by irradiating the liquid resin 15 with ultraviolet rays transmitted by the pressing surface 68 and the cover film 17. Thereafter, when the curing unit 66 is stopped and the pressing portion 64 is raised, the cover film 17 remains on the cured liquid resin 15. That is, a protective member 19 in which the resin film 13, the cured liquid resin 15, and the cover film 17 are integrated with each other is formed on the top surface 1a of the substrate 1. Here, the upper surface of the support table 54 and the pressing surface 68 are parallel with each other. The undersurface 1b of the substrate 1 and the upper surface of the protective member 19 are therefore parallel with each other. FIG. 7B is a sectional view schematically illustrating, in enlarged dimension, the protective member 19 formed on the substrate 1 having the projections and depressions of the bumps 7 on the top surface 1a.

In the protective member forming apparatus 2 according to the present embodiment, the liquid resin 15 is pressed by the flat pressing surface 68 from above via the cover film 17. In a case where the liquid resin 15 is pressed from above by a surface having projections and depressions such as the top surface 1a of the substrate 1 or the like as in related art, the projections and depressions may hinder uniform spread of the liquid resin 15, and nonuniformity may occur in the liquid resin 15. In this case, when the substrate 1 is supported by a table via the formed protective member, and the substrate 1 is ground from the undersurface 1b side, the support of the substrate 1 may be insufficient, and thus, the grinding may not be able to be performed properly. On the other hand, the protective member forming apparatus 2 according to the present embodiment can press the liquid resin 15 by the flat pressing surface 68. Thus, the liquid resin 15 is uniformly spread over the top surface 1a of the substrate 1, and the nonuniformity caused by the projections and depressions of the pressing surface does not occur in the liquid resin 15. Therefore, when the substrate 1 is ground from the undersurface 1b side, the substrate 1 is properly supported by the table via the protective member 19, and the grinding of the substrate 1 is performed properly.

Figure 8:
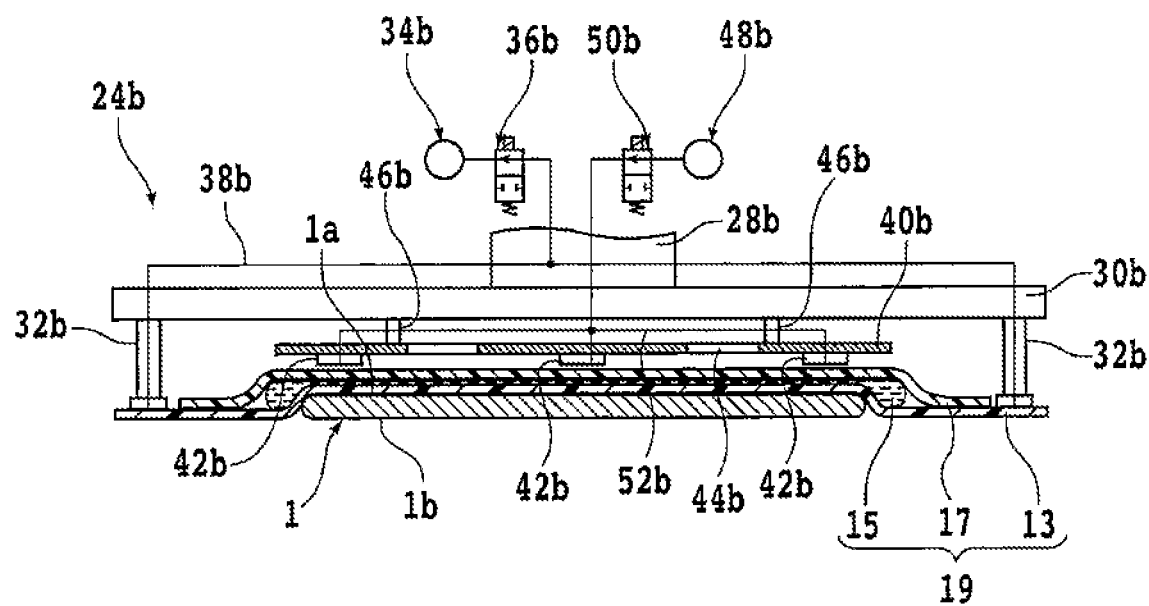
FIG. 8 is a sectional view schematically illustrating the substrate provided with the protective member held by a transfer unit.

The protective member forming apparatus 2 includes a cutting unit 74 (see FIG. 9A and FIG. 9B) that cuts off an unnecessary part of the protective member 19 formed on the top surface 1a of the substrate 1. The cutting of the protective member 19 by the cutting unit 74 is performed on a table 72 provided at a position adjacent to the support table 54 on the base 4. The protective member forming apparatus 2 includes a transfer unit 24b that can transfer the substrate 1 on which the protective member 19 is formed from the support table 54 to the table 72. Incidentally, the transfer unit 24b is formed in a similar manner to the transfer unit 24a, and therefore, description thereof will be partially omitted. FIG. 2 schematically illustrates a top view of the transfer unit 24b. FIG. 8 schematically illustrates a side view of the transfer unit 24b. The transfer unit 24b includes a guide rail 26b along a direction in which the support table 54 and the table 72 are arranged and an arm portion 28b slidably fitted to the guide rail 26b. The transfer unit 24b includes a moving mechanism (not illustrated) that moves the arm portion 28b and a base portion 30b along the guide rail 26b.

The base portion 30b is fixed to a distal end side of the arm portion 28b. A plate-shaped noncontact type suction pad supporting portion 40b is fixed to the central lower surface of the base portion 30b via a plurality of columnar supporting portions 46b. FIG. 8 illustrates a sectional view of the noncontact type suction pad supporting portion 40b. A through hole 44b is formed in the noncontact type suction pad supporting portion 40b. A plurality of noncontact type suction pads 42b are provided to the lower surface of the noncontact type suction pad supporting portion 40b. In addition, a plurality of suction pads 32b are fixed to the lower surface of an outer circumferential portion of the base portion 30b. Here, the lower surfaces of the plurality of suction pads 32b are at a uniform height, and the lower surfaces of the plurality of noncontact type suction pads 42b are at a uniform height. The height of the lower surfaces of the suction pads 32b is at a position lower than the height of the lower surfaces of the plurality of noncontact type suction pads 42b.

The lower surfaces of the suction pads 32b and the noncontact type suction pads 42b serve as suction surfaces. The transfer unit 24b includes a suction passage 38b having one end reaching the lower surface of each of the suction pads 32b and having another end connected to a suction source 34b. The suction passage 38b is provided with a switching unit 36b. In addition, the transfer unit 24b includes an air supply passage 52b having one end reaching the lower surface of each of the noncontact type suction pads 42b and having another end connected to an air supply source 48b. The air supply passage 52b is provided with a switching unit 50b.

FIG. 8 schematically illustrates a sectional view of the substrate 1 provided with the protective member 19 transferred by the transfer unit 24b. When the transfer unit 24b transfers the substrate 1 provided with the protective member 19, the base portion 30b is moved to a position above the support table 54. Then, the base portion 30b is lowered to bring the lower surfaces of the suction pads 32b into contact with the resin film 13 and bring the lower surfaces of the noncontact type suction pads 42b close to the protective member 19. Then, the switching unit 36b and the switching unit 50b are actuated to suck and hold the resin film 13 by the suction pads 32b and suck and hold the protective member 19 by the noncontact type suction pads 42b. Thereafter, the base portion 30b is raised, the base portion 30b is moved to a position above the table 72, and the base portion 30b is lowered to place the substrate 1 on which the protective member 19 is formed onto the table 72.

Thereafter, first, the switching unit 36b is actuated to release the suction of the resin film 13 by the suction pads 32b. Next, the switching unit 50b is actuated to release the sucking and holding of the protective member 19 by the noncontact type suction pads 42b. In this case, the substrate 1 is placed on the table 72 in a state in which the resin film 13 is spread over the table 72 due to a flow of gas jetted from the noncontact type suction pads 42a. While the noncontact type suction pads 42b suck the resin film 13, the flow of the gas from the noncontact type suction pads 42b cools the protective member 19 and increases hardness of the protective member 19. It is therefore easy to cut off the unnecessary part of the protective member 19.

Figure 9A:
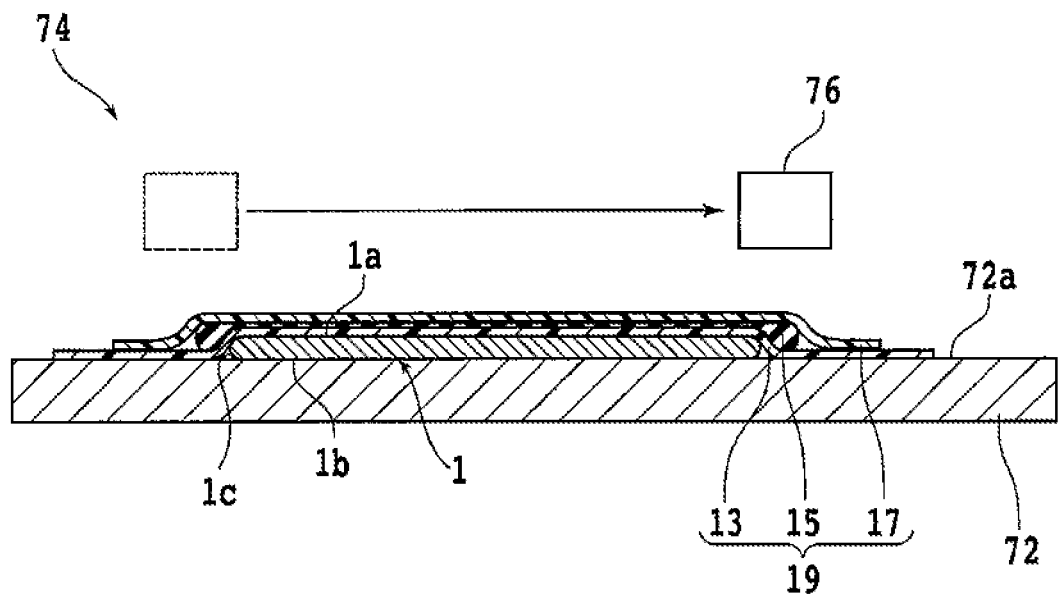
FIG. 9A is a sectional view schematically illustrating a state in which an imaging unit images the substrate from the top surface side.
Figure 9B:
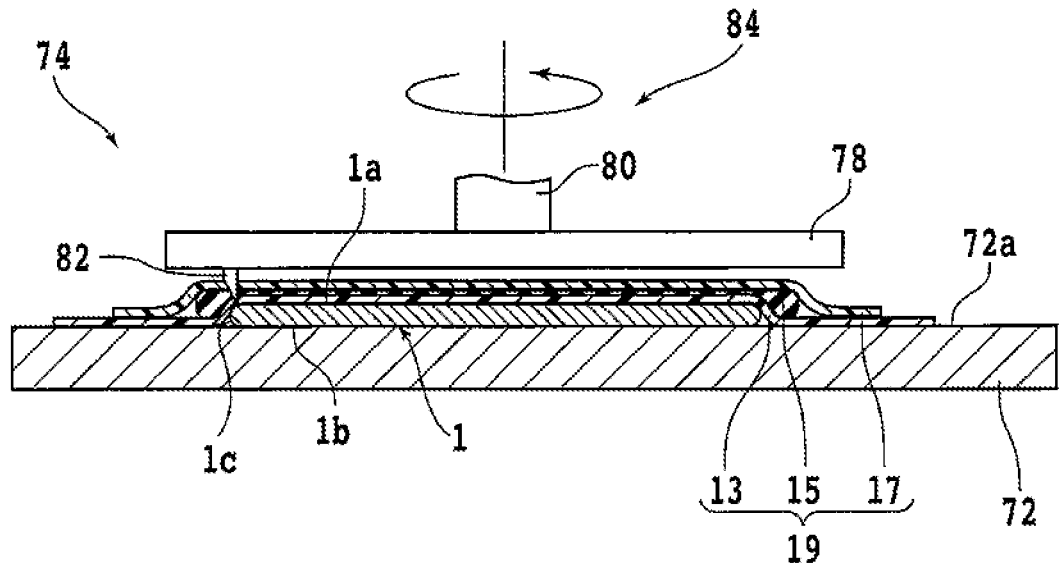
FIG. 9B is a sectional view schematically illustrating a state of cutting the protective member formed on the top surface of the substrate along the outer circumference of the substrate.

Incidentally, the table 72 may have a holding mechanism that can suck and hold the substrate 1. In this case, the upper surface of the table 72 is a holding surface 72a. The table 72 is, for example, a chuck table that includes a porous member exposed on the holding surface 72a and a suction source connected to the porous member and sucks and holds the substrate 1 placed on the holding surface 72a by actuating the suction source. As illustrated in FIG. 9A, an imaging camera 76 movable in a direction parallel with the holding surface 72a of the table 72 is provided above the table 72. When the protective member formed on the top surface 1a of the substrate 1 is cut along an outer circumference 1c of the substrate 1, the substrate 1 is imaged by the imaging camera 76 through the protective member 19, and the position of the outer circumference 1c of the substrate 1 is checked. At this time, when the position of the substrate 1 is displaced from a planned position of the holding surface 72a and the orbit of a cutting portion 82 of the cutting unit 74 to be described next is not along the outer circumference 1c of the substrate 1, the position of the substrate 1 may be adjusted by placing the substrate 1 by the transfer unit 24b again. Thereafter, as illustrated in FIG. 9B, the cutting unit 74 cuts the protective member 19.

The cutting unit 74 will next be described. The cutting unit 74 includes the table 72 that supports the substrate 1 having the protective member 19 formed on the top surface 1a. The cutting unit 74 further includes a rotary shaft 80 along a direction perpendicular to the holding surface 72a of the table 72; a disk-shaped cutting portion supporting portion 78 fixed to a lower end of the rotary shaft 80; and a cutting portion 82 fixed to an outer circumferential side of the lower surface of the cutting portion supporting portion 78. The cutting portion 82 is, for example, a cutter having a sharp lower edge. The rotary shaft 80 is movable in a direction parallel with the holding surface 72a of the table 72. When the substrate 1 is placed on the holding surface 72a of the table 72, the cutting unit 74 identifies the position of the outer circumference 1c of the substrate 1 by the imaging camera 76 and moves the rotary shaft 80 to a position above the center of the substrate 1. A rotation driving source not illustrated is connected to an upper end of the rotary shaft 80. When the rotation driving source is actuated to rotate the rotary shaft 80, the cutting portion 82 fixed to the lower surface of the cutting portion supporting portion 78 moves in an annular orbit along the outer circumference 1c of the substrate 1. That is, the rotation driving source, the rotary shaft 80, and the cutting portion supporting portion 78 function as a cutting portion moving unit 84 that moves the cutting portion 82.

When the cutting unit 74 cuts the protective member 19, the cutting unit 74 lowers the rotary shaft 80 while revolving and moving the cutting portion 82 by actuating the cutting portion moving unit 84, and thereby the cutting unit 74 makes the cutting portion 82 cut in along the outer circumference 1c of the substrate 1. That is, the cutting unit 74 can cut the protective member 19 along the outer circumference 1c of the substrate 1 by moving the cutting portion 82 along the outer circumference 1c of the substrate 1 by the cutting portion moving unit 84. After the cutting unit 74 cuts off the unnecessary part of the protective member 19, grinding of the substrate 1 becomes possible. An unnecessary part collecting unit 86 that collects the cut-off unnecessary part of the protective member 19 is provided at a position adjacent to the table 72 on the base 4. For example, the unnecessary part of the protective member 19 is transferred to the unnecessary part collecting unit 86 by the transfer unit 24b, the unnecessary part is dropped onto the unnecessary part collecting unit 86 by releasing the suction of the unnecessary part, and the unnecessary part is collected. After the cutting unit 74 cuts off the unnecessary part of the protective member 19, the substrate transfer robot 10b carries out the substrate 1 having the protective member 19 formed on the top surface 1a from the table 72 and houses the substrate 1 having the protective member 19 formed on the top surface 1a into the cassette 8b mounted on the cassette mounting base 6b. Thereafter, the cassette 8b is transferred to the grinding apparatus, and the grinding apparatus grinds the substrate 1 from the undersurface 1b side.

Figure 10:
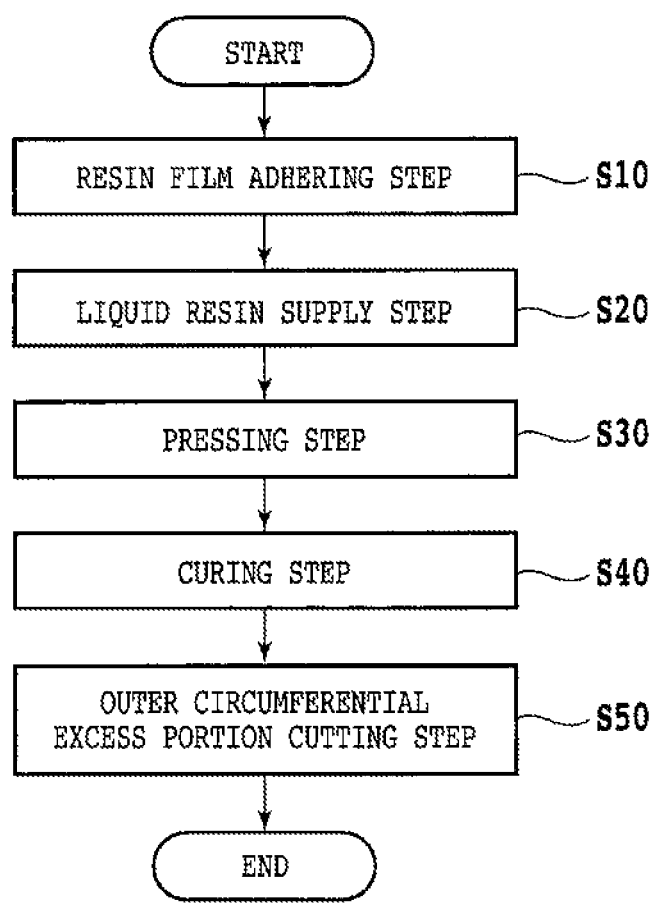
FIG. 10 is a flowchart illustrating a flow of steps of a protective member forming method.

Description will next be made of a protective member forming method according to the present embodiment for forming the protective member 19 on the top surface 1a of the substrate 1, the protective member forming method being performed by using the protective member forming apparatus 2 described above. FIG. 10 is a flowchart illustrating a flow of steps performed in the protective member forming method.

The protective member forming method first performs a resin film adhering step S10. In the resin film adhering step S10, the top surface 1a of the substrate 1 is covered by the resin film 13, and the resin film 13 is adhered so as to conform to the projections and depressions of the top surface 1a of the substrate 1. The resin film adhering step S10 is, for example, performed by the resin film adhering unit 12 of the protective member forming apparatus 2. FIG. 3A is a sectional view schematically illustrating the resin film adhering step S10. More specifically, the upper main body 12b of the resin film adhering unit 12 is raised, and the substrate 1 is loaded onto the supporting surface 14a of the substrate supporting portion 14 in the lower main body 12a. At this time, the top surface 1a having the projections and depressions is directed upward, and the undersurface 1b side is directed to the supporting surface 14a. Next, the resin film 13 is placed on the lower main body 12a such that the resin film 13 covers the top surface 1a of the substrate 1, and the opening of the lower main body 12a is closed by the resin film 13. Thereafter, the upper main body 12b is lowered, and the upper main body 12b is mounted on the lower main body 12a with the resin film 13 interposed therebetween.

Thereafter, the exhaust unit 16 is actuated to decompress the space 20a enclosed by the lower main body 12a and the resin film 13, and the exhaust unit 18 is actuated to decompress the space 20b enclosed by the upper main body 12b and the resin film 13. When the exhaust unit 18 is thereafter stopped, and further, the space 20b is opened to the atmosphere, a pressure difference rapidly occurring between the upper and lower sides of the resin film 13 causes the resin film 13 to adhere to the top surface 1a so as to conform to the projections and depressions of the top surface 1a of the substrate 1. Here, when heated gas is supplied to the space 20b before or after the space 20b is decompressed, the resin film 13 can be heated by the gas. In this case, the resin film 13 is softened. Thus, the resin film 13 easily follows the projections and depressions of the top surface 1a of the substrate 1, and the resin film 13 adheres to the top surface 1a of the substrate 1 more easily.

After the resin film adhering step S10 is performed, a liquid resin supply step S20 is performed. The liquid resin supply step S20 is, for example, performed on the support table 54 of the protective member forming apparatus 2. Accordingly, a first transfer step of transferring the substrate 1 to which the resin film 13 adheres by the transfer unit 24a may be performed before the liquid resin supply step S20 is performed. The first transfer step will be described with reference to FIG. 4A, FIG. 4B, and FIG. 5A.

The first transfer step uses the transfer unit 24a having the suction pads 32a and the noncontact type suction pads 42a. The noncontact type suction pads 42a can form a negative pressure at the centers of the lower surfaces thereof by jetting gas to the outsides of the lower surfaces thereof. As illustrated in FIG. 4A, in the first transfer step, first, the suction pads 32a suck and hold the resin film 13 in a region not superimposed on the substrate 1, and the noncontact type suction pads 42a suck and hold the resin film 13 in the region superimposed on the substrate 1. Thereafter, the substrate 1 to which the resin film 13 adheres is transferred to the support table 54 by actuating the moving mechanism of the transfer unit 24a. Then, the substrate 1 to which the resin film 13 adheres is placed on the support table 54 by releasing the sucking and holding of the resin film 13 by the transfer unit 24a.

In a case of simultaneously releasing the sucking and holding of the resin film 13 by the suction pads 32a and the sucking and holding of the resin film 13 by the noncontact type suction pads 42a, for example, a bend or a wrinkle may remain in an outer circumferential portion of the resin film 13 adhering to the substrate 1 mounted on the support table 54. In this case, an appropriate protective member 19 is not formed when the liquid resin supply step S20, a pressing step S30, and a curing step S40 are performed as described later. Accordingly, as illustrated in FIG. 4B, the first transfer step of the protective member forming method according to the present embodiment first releases the sucking and holding of the resin film 13 by the suction pads 32a after placing the substrate 1 on the support table 54. Thereafter, as illustrated in FIG. 5A, the sucking and holding of the resin film 13 by the noncontact type suction pads 42a is released.

In this case, in a period from the releasing of the sucking and holding of the resin film 13 by the suction pads 32a to the releasing of the sucking and holding of the resin film 13 by the noncontact type suction pads 42a, the gas jetted from the noncontact type suction pads 42a travels over the resin film 13. Then, the flow of the gas over the resin film 13 spreads the resin film 13 outward, so that the bend or the wrinkle in the resin film 13 on the support table 54 is reduced. That is, when the first transfer step is performed, the liquid resin supply step S20, the pressing step S30, and the curing step S40 to be described later can be performed properly, and the protective member 19 can be formed on the substrate 1 as intended.

The liquid resin supply step S20 is thereafter performed at the support table 54. The liquid resin supply step S20 supplies a curable liquid resin to a region superimposed on the substrate 1 on the upper surface of the resin film 13 adhering to the substrate 1. More specifically, after the transfer unit 24a transfers the substrate 1 to the support table 54, the nozzle 56c is positioned above the center of the substrate 1 by rotating the shaft portion 56a of the liquid resin supply unit 56. Then, the liquid resin 15 is discharged from the nozzle 56c to the region superimposed on the substrate 1 on the upper surface of the resin film 13. FIG. 5B schematically illustrates a sectional view of the substrate 1 to which the liquid resin 15 is discharged. Here, the amount of the liquid resin 15 discharged from the nozzle 56c is such that a layer capable of sufficiently accommodating the projections and depressions of the top surface 1a can be formed over the entire area of the top surface 1a of the substrate 1. The amount of supply of the liquid resin 15 is preferably determined on the basis of the size of the projections and depressions of the top surface 1a, the thickness of the protective member 19 to be formed on the top surface 1a, the thickness of the resin film 13 and the cover film 17, and the like. Incidentally, it is difficult to uniformly form the protective member 19 of a predetermined thickness when the amount of the liquid resin 15 is insufficient. Thus, the liquid resin 15 is preferably supplied slightly excessively.

The protective member forming method according to the present embodiment performs a pressing step S30 after the liquid resin supply step S20. The pressing step S30 covers the liquid resin 15 supplied onto the upper surface of the resin film 13 by the cover film 17, presses the liquid resin 15 by the flat pressing surface 68 via the cover film 17, and thereby spreads the liquid resin 15 over the resin film 13. The pressing unit 58, for example, is used for the pressing step S30. FIG. 7A is a sectional view schematically illustrating a state of pressing the liquid resin 15 by the pressing unit 58.

The pressing step S30 will be described in detail. First, the cover film 17 is held by the pressing surface 68 of the pressing portion 64 of the pressing unit 58. Then, the pressing surface 68 is brought into contact with the liquid resin 15 with the cover film 17 interposed therebetween by lowering the pressing portion 64. The pressing portion 64 is thereafter lowered further to press the liquid resin 15 by the pressing surface 68. At this time, the height of the pressing portion 64 is determined with reference to a planned thickness of the protective member to be formed on the top surface 1a of the substrate 1. That is, the pressing surface 68 is positioned at a height position at which the protective member 19 of a predetermined thickness can be formed. When the liquid resin 15 is pressed, the liquid resin 15 is spread in an outward direction from a central region on the substrate 1. A part of the liquid resin 15 supplied onto the resin film 13 by which part the amount necessary to form the protective member 19 is exceeded collects on the outside of the substrate 1. Here, when the liquid resin 15 protrudes outward beyond the resin film 13 and the cover film 17, the liquid resin 15 may go around to the undersurface 1b side of the substrate 1 and the upper surface side of the cover film 17. It is therefore preferable to use the resin film 13 and the cover film 17 of a sufficient size.

Incidentally, the pressing step S30 presses the liquid resin 15 by the flat pressing surface 68. When the pressing surface 68 that presses the liquid resin 15 is a surface having projections and depressions, for example, the projections and depressions hinder uniform spread of the pressed liquid resin 15. On the other hand, the protective member forming method according to the present embodiment can uniformly spread the liquid resin 15. In addition, the protective member forming method according to the present embodiment presses the liquid resin 15 by lowering the pressing portion 64 rather than supporting the substrate 1 from above and pressing the liquid resin 15 by lowering the substrate 1. In a case where the substrate 1 is raised and lowered in a state of not being supported from below, there is a fear of the substrate 1 falling and being damaged. However, the protective member forming method according to the present embodiment supports the substrate 1 from below. Thus, there is no fear of the substrate 1 being damaged, and the handling of the substrate 1 is facilitated.

A curing step S40 is performed after the pressing step S30 is performed. The curing step S40 cures the liquid resin 15 spread over the resin film 13 in the pressing step S30 and thereby forms, on the top surface 1a of the substrate 1, the protective member 19 including the resin film 13, the cured liquid resin 15, and the cover film 17. In a case where the liquid resin 15 is an ultraviolet curing resin, for example, the liquid resin 15 is cured by being irradiated with ultraviolet rays from the curing unit 66 including ultraviolet LEDs. When the liquid resin 15 is cured, the protective member 19 in which the resin film 13, the cured liquid resin 15, and the cover film 17 are integrated with each other is formed on the top surface 1a of the substrate 1. Incidentally, the protective member forming method according to the present embodiment may further perform an outer circumferential excess portion cutting step S50 of cutting the protective member 19 along the outer circumference 1c of the substrate 1 after performing the curing step S40.

The outer circumferential excess portion cutting step S50 is, for example, performed by the cutting unit 74. The outer circumferential excess portion cutting step S50 moves the rotary shaft 80 to a position above the center of the substrate 1, makes the cutting portion 82 cut into the protective member 19 along the outer circumference 1c of the substrate 1 by lowering the cutting portion 82 while moving the cutting portion 82 in an annular orbit, and thereby cuts off an excess portion of the protective member 19. Then, the protective member 19 is formed in such a size as to be able to protect the top surface 1a of the substrate 1 without excess or insufficiency.

Incidentally, the protective member forming method according to the present embodiment may perform a second transfer step of transferring the substrate 1 on which the protective member 19 is formed from the support table 54 to the table 72 before performing the outer circumferential excess portion cutting step S50. The second transfer step will be described with reference to FIG. 8. The second transfer step uses the transfer unit 24b having the suction pads 32b and the noncontact type suction pads 42b. The noncontact type suction pads 42b can form a negative pressure at the centers of the lower surfaces thereof by jetting gas to the outsides of the lower surfaces thereof. In the second transfer step, as in the first transfer step, the suction pads 32b suck and hold the resin film 13 in the region not superimposed on the substrate 1, and the noncontact type suction pads 42b suck and hold the cover film 17 in the region superimposed on the substrate 1. The moving mechanism of the transfer unit 24b is thereafter actuated to transfer the substrate 1 on which the protective member 19 is formed to the table 72 of the cutting unit 74. Then, the substrate 1 is placed on the table 72 by releasing the sucking and holding by the transfer unit 24b.

In a case of simultaneously releasing the sucking and holding of the resin film 13 by the suction pads 32b and the sucking and holding of the cover film 17 by the noncontact type suction pads 42b, for example, a bend may remain in an outer circumferential portion of the resin film 13 or the cover film 17. In this case, when the outer circumferential excess portion cutting step S50 is performed, the bent part of the resin film 13 or the cover film 17 may enter the orbit of the cutting portion 82 and hinder the movement of the cutting portion 82. Accordingly, after placing the substrate 1 on the table 72, the second transfer step releases the sucking and holding of the resin film 13 by the suction pads 32b and thereafter releases the sucking and holding of the cover film 17 by the noncontact type suction pads 42b. In this case, in a period from the releasing of the sucking and holding of the resin film 13 by the suction pads 32b to the releasing of the sucking and holding of the cover film 17 by the noncontact type suction pads 42b, the gas jetted from the noncontact type suction pads 42b travels over the protective member 19.

Then, the flow of the gas spreads the cover film 17 or the like outward. The bend in the cover film 17 or the like is therefore removed. That is, the outer circumferential excess portion cutting step S50 can be performed properly when the second transfer step is performed. Incidentally, the gas jetted from the noncontact type suction pads 42b continues traveling over the protective member 19 while the second transfer step is performed. The protective member 19 consequently continues to be air-cooled and increases in hardness.

When the protective member 19 has high flexibility at a time that the cutting portion 82 cuts into the protective member 19 in the outer circumferential excess portion cutting step S50, a force acting on the protective member 19 from the cutting portion 82 may be unable to act properly because the protective member 19 is deformed, for example. Then, a problem of a rough cut surface of the protective member 19 or the like may occur. Accordingly, when the protective member 19 is air-cooled and increased in hardness by performing the second transfer step using the transfer unit 24b having the noncontact type suction pads 42b, the force can be made to act on the protective member 19 from the cutting portion 82 properly. The protective member 19 is therefore cut with higher quality.

The substrate 1 having the protective member 19 formed on the top surface 1a as a result of the above is thereafter transferred to the grinding apparatus and is thinned to a predetermined thickness by being ground from the undersurface 1b side in the grinding apparatus. The protective member 19 is thereafter peeled off the top surface 1a side of the substrate 1. At this time, the cured liquid resin 15 is formed on the top surface 1a with the resin film 13 interposed therebetween and is therefore not directly affixed to the projections and depressions of the top surface 1a of the substrate 1. Thus, a residue of the cured liquid resin 15 or the like does not remain on the top surface 1a of the substrate 1. The protective member 19 can therefore be peeled off the substrate 1 easily.

It is to be noted that the present invention is not limited to the description of the foregoing embodiment and can be modified and carried out in various manners. For example, in the foregoing embodiment, the resin film adhering unit 12 is a unit in the form of a chamber having the lower main body 12a and the upper main body 12b. However, the resin film adhering unit 12 may be in another form. For example, a chuck table that can suck and hold a holding object placed on an upper surface thereof can be used. The chuck table, for example, includes a porous member exposed upward. The chuck table further includes a suction passage having one end communicating with the porous member and a suction source functioning as an exhaust unit connected to another end of the suction passage. When the suction source is actuated, a negative pressure can be made to act on the holding object placed on the upper surface of the porous member via the suction passage and the porous member. The upper surface of the porous member serves as a suction holding surface of the chuck table, and the porous member functions as a substrate supporting portion that supports the substrate 1. Here, the chuck table in which the suction holding surface has a size larger than the substrate 1 and smaller than the resin film 13 is prepared as a resin film adhering unit.

Then, when the resin film 13 is adhered to the top surface 1a of the substrate 1, the substrate 1 is first placed on the suction holding surface of the chuck table in a state in which the top surface 1a of the substrate 1 is exposed upward. Then, the resin film 13 is placed on the chuck table so as to cover the suction holding surface. At this time, the substrate 1 supported by the porous member functioning as the substrate supporting portion is covered by the resin film 13, and a space is formed between the resin film 13 and the porous member. The space is thereafter exhausted and decompressed by actuating the suction source of the chuck table which suction source functions as the exhaust unit, so that the resin film 13 is adhered to the top surface 1a so as to conform to the projections and depressions of the top surface 1a of the substrate 1 supported by the porous member functioning as the substrate supporting portion.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective member forming apparatus for forming a protective member on a top surface of a substrate having projections and depressions on the top surface, the protective member forming apparatus comprising:
   a resin film adhering unit including a substrate supporting portion supporting the substrate and an exhaust unit capable of exhausting a space formed by covering the substrate supported by the substrate supporting portion with a resin film, the resin film adhering unit being configured to exhaust and decompress the space by actuating the exhaust unit and adhere the resin film to the top surface so as to conform to the projections and depressions of the top surface of the substrate;
   a support table configured to support the substrate to which the resin film adheres, in a state in which the resin film is exposed upward;
   a liquid resin supply unit including a nozzle that discharges a curable liquid resin and configured to supply the liquid resin from the nozzle onto an upper surface of the resin film adhering to the substrate supported by the support table;
   a pressing unit having a flat pressing surface and configured to spread the liquid resin over the resin film by pressing the liquid resin by the pressing surface via a cover film while covering the liquid resin supplied by the liquid resin supply unit with the cover film; and
   a curing unit configured to cure the liquid resin spread by the pressing unit and form the protective member including the resin film, the cured liquid resin, and the cover film on the top surface of the substrate;
   a cutting unit including a table configured to support the substrate having the protective member formed on the top surface being capable of cutting outer circumferential excess portion of the protective member along an outer circumference of the substrate;
   an unnecessary part collecting unit collects the cut-off outer circumferential excess portion of the protective member.

2. The protective member forming apparatus according to claim 1, further comprising:
- a transfer unit configured to transfer the substrate to which the resin film adheres from the substrate supporting portion to the support table while the resin film remains in a spread state on an outside of the substrate,
- the transfer unit including a noncontact type suction pad configured to generate a negative pressure while jetting a fluid toward the top surface of the substrate,
- a suction pad configured to suck and hold the resin film on the outside of the substrate,
- a base portion to which the noncontact type suction pad and the suction pad are fixed, and a moving mechanism configured to move the base portion,
- the noncontact type suction pad and the suction pad being able to be actuated independently of each other.

3. The protective member forming apparatus according to claim 2, further comprising: a cutting portion moving unit configured to move the cutting portion along an outer circumference of the substrate, supported by the table and having the protective member formed on the top surface.

* * * * *